United States Patent
Nakajima

(10) Patent No.: US 7,369,976 B1
(45) Date of Patent: May 6, 2008

(54) METHOD OF DESIGNING TIRE, OPTIMIZATION ANALYZER AND STORAGE MEDIUM ON WHICH OPTIMIZATION ANALYSIS PROGRAM IS RECORDED

(75) Inventor: Yukio Nakajima, Tokyo (JP)

(73) Assignee: Bridgestone Corporation, Tokyo (JP)

( * ) Notice: Subject to any disclaimer, the term of this patent is extended or adjusted under 35 U.S.C. 154(b) by 0 days.

(21) Appl. No.: 09/269,972

(22) PCT Filed: Aug. 8, 1997

(86) PCT No.: PCT/JP97/02783

§ 371 (c)(1),
(2), (4) Date: Apr. 8, 1999

(87) PCT Pub. No.: WO99/07543

PCT Pub. Date: Feb. 18, 1999

(51) Int. Cl.
*G06G 7/48* (2006.01)
*G06F 15/00* (2006.01)
*G06F 17/00* (2006.01)
*G06N 3/10* (2006.01)

(52) U.S. Cl. ............ 703/6; 703/7; 703/8; 706/44; 706/900; 706/913; 706/919; 706/920

(58) Field of Classification Search ............ 703/8, 703/7, 6; 395/13; 706/44, 900, 913, 919, 706/920
See application file for complete search history.

(56) References Cited

U.S. PATENT DOCUMENTS

| | | | | |
|---|---|---|---|---|
| 5,226,092 A | * | 7/1993 | Chen | 382/157 |
| 5,435,365 A | * | 7/1995 | Tanaka | 152/209.8 |
| 5,617,341 A | * | 4/1997 | Nakajima | 703/8 |
| 5,710,718 A | | 1/1998 | Kamegawa et al. | |
| 5,717,613 A | * | 2/1998 | Nakajima | 703/1 |
| 6,061,673 A | * | 5/2000 | Tang | 706/25 |

FOREIGN PATENT DOCUMENTS

| | | |
|---|---|---|
| EP | 0 647 911 A2 | 4/1995 |
| JP | 7-156238 | 6/1995 |
| JP | 8-235242 | 9/1996 |
| JP | 9-16654 | 1/1997 |
| WO | WO 94/16877 | 4/1994 |

OTHER PUBLICATIONS

Handbook of Industrial Engineering, Second Edition, by Gavriel Savandy, John Wiley & Sons, Inc., 1992, ISBN 0-471-50276-6, pp. 962 to 963, seven features of neural network models.*

(Continued)

*Primary Examiner*—Paul Rodriguez
*Assistant Examiner*—Dwin McTaggart Craig
(74) *Attorney, Agent, or Firm*—Sughrue Mion, PLLC

(57) ABSTRACT

A design of a tire can be facilitated. An optimization apparatus 30 inputs known design parameters of the shape, structure, and pattern of a tire, and performances thereof by an experimental data input unit 40 and learns, as a conversion system of a neural network, a correlation between design parameters of the shape, structure, and pattern of the tire, and performances thereof. Ranges which constrain performances of the tire and design parameters of the shape, structure, and pattern of the tire, which are to be optimized, are inputted in an optimization item input unit 42, and the performances of the tire are predicted in an optimization calculation unit 34 from the design parameters of the shape, structure, and pattern of the tire by using the optimization item and models of the calculation unit 32, and an objective function is optimized until the objective function which is the performances of the tire is converged. The optimized design parameters of the shape, structure, and pattern of the tire are outputted from an optimization result output unit 44.

19 Claims, 18 Drawing Sheets

OTHER PUBLICATIONS

The Computer Science and Engineering Handbook, by Allen B. Tucker, Jr. (Editor-in-chief), CRC Press, ISBN: 0-8493-2909-4, 1996, pp. 557 to 568, genetic algorithms.*

Merriam-Webster's Collegiate Dictionary, Tenth Edition, Copyright 2001, ISBN 0-87779-708-0, p. 413.*

Optimum Young's Modulus Distribution in Tire Design, XP-001030061, Tire Sci Technol; Tire Science & Technology Jul.-Sep. 1996, vol. 24, No. 3, pp. 204-219.

Neural Network Learning In Engineering Design, XP-000145317, Proceedings of the International Conference on Neural Networks, Paris Jul. 9-13, 1990, Dordrecht, Kluwer Academic, NL., vol. 1, pp. 412-415.

"Non-Linear Multi-Variate Analysis-Approach by Neural Network", Hideki Toyota, pp. 11-13 and pp. 162-166, published by Asakura Book Store in 1996.

"Empirical Model-Building and Response Surfaces", Box and Draper, published by John Wiley & Sons, New York, date unknown.

* cited by examiner

METHOD OF DESIGNING TIRE, OPTIMIZATION ANALYZER AND STORAGE MEDIUM ON WHICH OPTIMIZATION ANALYSIS PROGRAM IS RECORDED

FIELD OF THE INVENTION

The present invention relates to a tire design method, an optimization analyzing apparatus, and a storage medium in which an optimization analyzing program is stored, and particularly to a tire design method, an optimization analyzing apparatus, and a storage medium in which an optimization analyzing program is stored, which can be used for design of the structure, shape, and pattern of a tire, for example, design of the shape of a side wall or a crown portion of a tire.

BACKGROUND ART

The design of the structure, shape, and pattern of a tire is to obtain the structure, shape, and pattern of a tire, manufacturing conditions thereof, and the like, which are required to obtain performances of a tire. The performances of the tire is a physical quantity which is obtained by calculation or experiment, or an on-vehicle riding quality evaluation result. A conventional tire design method, such as design of the structure, shape, and pattern of a tire, was realized by a trial-and-error empirical rule obtained by repetitions of experiments and numerical experiments using a calculator. For this reason, the number of trial manufacturing operations and testing operations, which are required for development of a tire, increases greatly, thereby resulting in an increase in developmental costs; further, it was difficult to reduce the period of time for development.

As a means for solving the above-described drawback, there have been proposed techniques for obtaining an optimal solution, for example, a mathematical programming method and an optimization method using a genetic algorithm. A designing method relating to this mathematical programming method has already been proposed by the present applicant in International Publication No. WO94/16877.

Obtaining an optimal solution is analogous to climbing a mountain. At this time, the height of the mountain is related to performance, and therefore, the optimal solution corresponds to the peak of the mountain. When an objective function is simple, a design space (a shape of the mountain) has the shape of a mountain with one peak as shown in FIG. 8, and therefore, the optimal solution can be obtained by an optimization approach based on mathematical programming.

However, when an objective function becomes complex, the design space has many peaks as shown in FIG. 9. For this reason, the optimal solution cannot be obtained by the optimization approach based on mathematical programming. The reason is that, in the optimization approach based on mathematical programming, a peak that was reached first by chance may be mistakenly regarded as the optimal solution.

Although a genetic algorithm has been proposed to solve the above-described problem, it requires a great number of experiments and much time for calculation, and there is also a possibility that calculation may not converge, and so there was a problem in terms of practical use. Namely, when an objective function becomes complex, it was difficult to obtain the optimal solution in a limited period of time.

However, the design development of a tire with a conventional tire design method used was regarded as summarily completed having set a target value for a certain performance and having cleared the target value, and was not provided to obtain the best performance with given resources. Further, this conventional design method was not a method to design an antinomic performance, nor a method to determine the best shape and structure. Moreover, in the conventional design method, development is effected by repeating trial-and-error manufacture and testing, and therefore, this method was very ineffective and cost performance thereof was low.

In view of the above-described circumstances, it is an object of the present invention to provide a tire design method, an optimization analyzing apparatus, and a storage medium in which an optimization analyzing program is stored, which allow design of the best mode of a tire under given conditions and which also allow design and development of the tire to become highly efficient.

DISCLOSURE OF THE INVENTION

The present inventors have studied various aspects in order to achieve the above-described object of the present invention, and as a result, have paid their attention to application of a "non-linear prediction technique, for example, a neural network, in which a neural circuit network of a higher animal is modeled in an engineering manner" and "optimization design approach", which are utilized in some fields except for a tire design field, to a special field of tire design, and also have carried out a research and established a tire design method in a concrete manner.

A tire design method of the present invention comprises the steps of: (a) determining a conversion system in which a non-linear correspondence between design parameters of a tire, which represent any one of a cross-sectional configuration of the tire including an internal structure and a structure of the tire, and performances of the tire is established; (b) determining an objective function which expresses said performances of the tire and setting a constraint condition which constrains an allowable range of at least one of said performances of the tire and manufacturing conditions of the tire; and (c) determining a design parameter of the tire, which gives an optimum value of an objective function, based on said objective function and said constraint condition by using the conversion system determined in said step (a) to design the tire based on the design parameter of the tire.

The performances of the tire, for example, values of stability of maneuvering and endurance of a belt, are determined by the design parameters of the tire, for example, a cross-sectional configuration of the tire including an internal structure thereof, a structure of the tire, and the like. However, there are many cases where the performances of the tire are not changed linearly even though the values of the cross-sectional configuration of the tire or the structure thereof are changed linearly. Accordingly, in the step (a) of the present invention, the conversion system in which a correlation between the design parameters of the tire, which indicates the cross-sectional configuration of the tire including the internal structure thereof or the structure of the tire, and the performances of the tire is established is determined in advance. This conversion system can be determined by using a non-linear prediction technique in which a neural circuit network such as a neural network is modeled by an engineering approach.

In the step (b), the objective function which expresses the performances of the tire is determined, and the constraint condition which constrains the allowable range of at least one of the performances of the tire and the manufacturing conditions thereof is also determined. As the objective function which expresses performances of the tire, for example, a physical quantity which governs excellency of performances of the tire, such as a belt tension in the circumferential direction of the tire or a transverse spring constant, at the time of air-filling, for improving stability of maneuvering, a road-contacting characteristic of a road-contacting surface of the tire during straight-line movement or under application of side force, and the like can be used. As the constraint condition which constrains the allowable range of at least one of the performances of the tire and the design parameters of the tire, for example, the constraint condition which constrains the cross-sectional configuration of the tire or the structure thereof, there are, for example, a constraint for a periphery value of a carcass line, a constraint for vertical and primary natural frequency, a constraint for an angle of a belt layer, and constraints for a width of a belt layer, tire dimensions, a spring constant, an amount of deformation of a tire, a weight of the tire, stress, skewness, skewness energy, and rolling resistance. The objective function and constraint condition are not limited to the aforementioned, and various kinds can be determined according to a design purpose of the tire.

In the step (c), the design parameter of the tire, which gives an optimum value of the objective function is determined based on the objective function and the constraint condition by using the conversion system determined in the step (a) and the tire is then designed based on the design parameter thus determined. As a result, the conversion system is determined in which the non-linear correspondence between the design parameters of the tire and the performances thereof is established and a mutual relation can be found in which a correlation between the design parameters of a plurality of tires and the performances thereof is established according to the conversion system. Accordingly, a tire having a high performance can be designed by designing a tire based on the design parameters of the tire, which give an optimum value of the objective function. In the step (c), a value of a design variable which gives an optimum value of the objective function can be obtained while the constraint condition is considered.

When the tire is designed in the step (c), the step (c) comprises the steps of: defining the design parameter of the tire as a design variable; obtaining a value of the design variable, which gives the optimum value of the objective function, by using the conversion system determined in said step (a) while considering the constraint condition; and designing the tire based on the design variable which gives the optimum value of the objective function. In such a manner, by considering the constraint condition, the allowable range of at least one of the performances of the tire and the design parameters thereof can be considered, and a range of a tire design can be specified in advance or a desired range thereof can also be set.

When a value of the design variable is obtained in the step (c), it is effective that the step (c) comprises: predicting an amount of change in the design variable which gives the optimum value of the objective function while considering the constraint condition based on a sensitivity of the objective function which is a ratio of an amount of change in the objective function to a unit amount of change in the design variable and a sensitivity of the constraint condition which is a ratio of an amount of change in the constraint condition to a unit amount of change in the design variable; calculating a value of the objective function when the design variable is changed to correspond to a predicted amount and a value of the constraint condition when the design variable is changed to correspond to a predicted amount; and based on the predicted and calculated values, obtaining a value of the design variable, which gives the optimum value of the objective function, by using the conversion system determined in said step (a) while considering the constraint condition. As a result, the value of the design variable when a value of the objective function becomes optimum under consideration of the constraint condition can be obtained. Then, a tire can be designed by modifying design parameters of the tire, or the like based on the design variable which gives the optimum value of the objective function.

Here, it has been known, as described above, that a process for obtaining an optimum value in a general optimization approach is analogous to climbing a mountain. In this case, the optimum value corresponds to the peak of the mountain if a height of the mountain is related to a performance or the like. Accordingly, in the case in which the objective function is simple, the design space is formed into a shape of the mountain shown in FIG. 8 and an optimum value thus can be obtained by an optimization approach based on a mathematical programming method. A description will roughly be given on an optimum design of a tire using a typical drawing in FIG. 8 as a model (conversion system), in which mountain climbing is used for illustration of optimization. The conversion system provides a non-linear correspondence between design parameters of the tire and performances thereof. The conversion system is shown to be at a level (as a contour) in the design space (in the shape like a mountain). That is, performances of the tire are correlated with various design parameters, and generally, as the performances of the tire approach an optimum value, the ranges of the design parameters are made narrower as is a contour. The ranges of the design parameters of the tire are generally limited by constraints in design and an actually allowable range, so that a relation between the performances of the tire which is an objective function, and the design parameters thereof can be restrained by a fence along a ridge of the mountain, as shown in FIG. 8. If the fence is assumed as constraint conditions, the relationship is considered to climb the mountain as shown in FIG. 8 with the help of an optimization approach, such as a mathematical programming method or the like up to the peak of the mountain where an optimal solution can be obtained for the objective function in such a manner that the relationship is kept from going over to the outside of the fence by changing the design variables within the conversion system.

In the present invention, when an optimal solution is obtained by the steps (a) to (c), execution of the following steps of (d) to (f) is indispensable to obtain the optimal solution. In more detail, the step (c) can comprise the steps of: (d) selecting, as a design variable, one of the design parameters of the tire included in the conversion system determined in the step (a); (e) changing a value of the design variable selected in the conversion system determined in the step (a) until an optimum value of the objective function is given by using the conversion system determined in the step (a) while considering the constraint condition; and (f) designing the tire based on the design parameter of the tire obtained by the design variable which gives the optimum value of the objective function. In the step (d), the one of the design parameters of the tire included in the conversion system is selected as the design variable. In the next step (e), a value of the design variable to be selected in the conversion system is changed until an optimum value of the objective function is given while considering the constraint condition. As a result, the value of the design variable changes subtly or gradually to obtain an optimum value of the objective function. In the step (f), the tire is designed based on the design parameter of the tire obtained by the design variable which gives an optimum value of the objective function. In such a manner, since one of design parameters of the tire included in the conversion system is selected as the design variable and the design variable to be selected is changed in the conversion system while considering the constraint condition until an optimum value of the objective function is obtained, without previously preparing a value of the design variable which gives the optimum value of the objective function, a design value which is close to a desired value of the design variable may be selected in the conversion system and a design of the tire having a higher performance can thereby be achieved.

In this case, in the step (b), the constraint condition which constrains an allowable range of at least one of the performances of the tire other than the determined objective function and the design parameters of the tire can be determined. In such a manner, the performances of the tire other than the objective function as an allowable range to be constrained can be used by determining the constraint condition which constrains the allowable range of at least one of the performances of the tire other than the determined objective function and the design parameters of the tire. When the constraint condition is not determined, the performances of the tire other than the objective function and the design parameters of the tire are departed from desired ranges and an application of the design may practically become difficult in most cases.

That is, the conversion system in which the non-linear correlation between the design parameters of the tire and the performances thereof selected as the objective function is established by a neural network or the like in the step (a) is shown by the contour in FIG. 8. The constraint condition determined in the step (b) is provided as a fence on the mountain whose shape is shown as a contour, and in the step (d) included in the step (c), the design variable selected to be a design parameter of the tire within the conversion system determined in the step (a) is changed, and further, in the step (e), climbing of the mountain is effected with the help of an optimization approach, such as a mathematical programming method or a genetic algorithm up to the peak of the mountain where an optimal solution can be obtained for the objective function in such a manner that the relationship is kept from going over to the outside of the fence. Moreover, the constraint condition (the fence) is effective for a guide in climbing a mountain in an optimization approach in addition to setting desired ranges of the performances of the tire other than the objective function and of the design parameters of the tire. That is, without a constraint condition, not only is a time for calculation increased but the calculation is not converged. Accordingly, the optimal solution can be obtained only with the steps (a) to (e) executed.

Further, the step (e) comprises: predicting an amount of change in the design variable which gives the optimum value of the objective function while considering the constraint condition based on a sensitivity of the objective function which is a ratio of an amount of change in the objective function to a unit amount of change in the design variable and a sensitivity of the constraint condition which is a ratio of an amount of change in the constraint condition to a unit amount of change in the design variable; calculating a value of the objective function when the design variable is changed to correspond to a predicted amount and a value of the constraint condition when the design variable is changed to correspond to a predicted amount; and based on the predicted and calculated values, changing a value of the design variable to be selected until the optimum value of the objective function is given by using the conversion system determined in said step (a) while considering the constraint condition. In such a manner, a value of the design variable until an optimum value of the objective function is given can be easily obtained by calculating a value of the objective function when a value of the design variable is changed to correspond to a predicted amount and a value of the constraint condition when a value of the design variable is changed to correspond to a predicted amount.

The present inventors have studied various aspects, and have paid their attention to application of a "genetic algorithmic means" which is utilized in a different technical field to a specific field of tire design, and also have carried out a research and established a tire design method in a concrete manner.

Concretely, in the tire design method of the present invention, the step (c) comprises the steps of: defining the design parameters of the tire in the conversion system determined in said step (a) as base models to determine a group for selection comprising a plurality of base models; determining said objective function, a design variable, a constraint condition and an adaptive function which can be evaluated from the objective function for each base model of the group for selection; selecting two base models from the groups for selection; effecting at least one of producing new base models by intersecting the design variables of the two base models at a predetermined probability with each other and producing new base models by modifying in part the design variables of at least one of the two base models; obtaining an objective function, a constraint condition, and an adaptive function of the base models using the conversion system determined in said step (a) by changing the design variable; storing the base models whose design variables have been changed and base models whose design variables have not been changed; repeating the storing step until the number of the stored base models reaches a predetermined number; determining whether a new group comprising the stored base models of the predetermined number satisfies a predetermined convergence condition; wherein if not, the above steps are repeated until with the new group defined as the group for selection the group for selection defined satisfies the predetermined convergence condition; and if the predetermined convergence condition is satisfied, designing a tire based on the design parameters of the tire obtained by the design variable, which gives the optimum value of the objective function, among the predetermined number of the stored base models by using the conversion system determined in said step (a) while considering the constraint condition.

In the step (a), the conversion system can be constructed with data in a multi-layered feed forward type neural network which has learned so as to convert the design parameters of the tire to the performances thereof.

As described above, as a general optimization approach, there are provided a mathematical programming method, a genetic algorithm or the like and a process for obtaining an optimal solution is analogous to mountain climbing. In this case, since a height of the mountain is related to a performance or the like, the optimum value corresponds to the peak of the mountain. In the case in which an objective function is simple, a design space thereof (a shape of a mountain) is formed like Mt. Fuji having one peak as shown in FIG. 1, the optimal solution can be obtained by an optimization method based on a mathematical programming method. However, when an object function is more complex, a design space has a plurality of peaks, as shown in FIG. 9, and therefore, an optimal solution cannot be obtained by the optimization approach based on a mathematical programming method. The reason is that the optimization approach based on a mathematical programming method recognizes a peak which is first reached by chance as an optimal solution among the plurality of peaks. A genetic algorithm has been proposed in order to solve this problem, but requires tremendous amounts of experiments and computational time and sometimes calculation has not been converged.

In the step (a), the conversion system in which the non-linear correlation between the design parameters of the tire (design variables) and the performances of the tire is established is determined by using a neural network. The performances of the tire are determined depending on the design parameters of the shape, structure, and pattern of the tire. However, there may be cases in which even if the design parameter is changed linearly, the performance of the tire is not changed linearly. Further, the neural network can be expected to have a prediction and a decision with higher accuracy than a linear transformation multi-variable analysis, a learning of a relationship between input data can be effected and thereby any function can be converted to an approximation with any accuracy if the number of units in an intermediate layer is increased and further the analysis has an advantage that it is excellent in extrapolation (see a book authored by Hideki Toyota "Non-Linear Multi-Variate Analysis—Approach by Neural Network" pages 11 to 13 and pages 162 to 166, published by Asakura Book Store in 1996). Therefore, in the present invention, the conversion system in which a correspondence between the design parameters of the tire and the performances thereof is established is determined in advance. This conversion system can be determined by using a non-linear prediction technique in which a neural circuit network such as a neural network is modeled in an engineering way. An optimal solution can be obtained, by applying a neural network in a combination with the above-described optimization technique, in a limited period in time even when the objective function is made complex.

In the case in which design and development are conducted based on a design method of the present invention, different from a conventional design development in which trial and error are fundamental, it becomes possible to conduct operations from the design of a tire having best performances to a performance evaluation of the tire, mainly by a computer calculation. As a result, conspicuous increase in efficiency is achieved and development costs can be decreased.

When a tire is formed based on design parameters of the tire designed by the above-described tire design method, the tire thus formed is structured by the design parameters having the best performance and the optimum design parameter can be directly determined according to applied conditions such as a manufacturing condition and a cost.

The above-described tire design method can be recognized by an optimization analyzing apparatus comprising: conversion system calculating means for obtaining a non-linear corresponding relation between design parameters of a tire and performances of the tire; input means for inputting an objective function and a constraint condition as optimization items by determining the objective function which expresses the performances of the tire and also by determining the constraint condition which constrains an allowable range of at least one of the performances of the tire and manufacturing conditions of the tire; and optimization calculation means for obtaining a design parameter of the tire which gives an optimum value of the objective function based on the optimization items inputted by said input means using said conversion system calculation means.

The conversion system calculation means can obtain a non-linear corresponding relation between, on the one hand, the design parameters of the tire and a condition to be applied to the tire, and on the other hand, the performances of the tire. As the applied conditions, there are provided manufacturing conditions during formation of the tire, the weight of the tire, the total cost thereof, or the like. Further, the conversion system calculation means comprises a multi-layered feed forward type neural network which has learned so as to convert the design variables of the tire to the performances of the tire.

Further, the optimization calculation means can comprise: selection means which selects one of the design parameters of the tire included in said conversion system calculation means as a design variable; changing means for changing a value of the design variable selected from said conversion system calculation means until the optimum value of the objective function is given, while considering the constraint condition; optimum value calculation means for calculating a value of the design variable until the optimum value of the objective function is given by using said conversion system calculation means; and design means for designing a tire based on the design parameter obtained by the design variable which gives the optimum value of the objective function.

The optimization calculation means comprises the steps of: defining the design parameters of the tire in the corresponding relation determined in said conversion system calculation means as base models to determine a group for selection composed of a plurality of base models; determining said objective function, a design variable, a constraint condition, and an adaptive function which can be evaluated from the objective function for each base model in the group for selection; selecting two base models from the group for selection; effecting at least one of producing new base models by intersecting the design variables of the selected two base models at a predetermined probability with each other and producing new base models by modifying in part the design variables of at least one of the two base models; obtaining an objective function, a constraint condition, and an adaptive function of the base models which have been produced using said conversion system calculation means by changing a design variable; storing the base model whose design variables have been changed and a base model whose design variables have not been changed; repeating the storing step until the number of the stored base models reaches a predetermined number; determining whether a new group comprising stored base models of the predetermined number satisfy a predetermined convergence condition; wherein if not, the new group is defined as the group for selection and the above steps are repeated until the group for selection defined satisfies the predetermined convergence condition; and if the predetermined convergence condition is satisfied, designing a tire based on a design parameter of the tire obtained by the design variable, which gives the optimum value of the objective function, among the predetermined number of the stored base models by using said conversion system calculation means while considering the constraint condition.

The conversion system calculation means can be comprised of a multi-layered feed forward type neural network which has learned so as to convert the design parameters of the tire to the performances thereof.

The above-described tire design method can provide a storage medium having a stored optimization analyzing program which is easily portable, the storage medium including a program having the following procedure. Namely, a storage medium having a stored optimization analyzing program for design of a tire executed by a computer, wherein the optimization analyzing program is provided to: determine a non-linear corresponding relation between design parameters of a tire and performances of the tire; determine an objective function which expresses the performances of the tire and determine a constraint condition which constrains an allowable range of at least one of the performances of the tire and manufacturing conditions of the tire; and obtain a design parameter of the tire, which gives an optimum value of the objective function, based on the determined corresponding relation, the objective function, and the constraint condition to design a tire based on the design parameter of the tire.

The design of a tire based on the design parameters of the tire comprises: selecting, as a design variable, one of the design parameters of the tire included in the determined corresponding relation based on the determined corresponding relation, the objective function, and the constraint condition; changing a value of the design variable selected from the determined corresponding relation until the optimum value of the objective function is given while considering the constraint condition; and designing the tire based on the design parameter of the tire obtained by the design variable which gives the optimum value of the objective function.

Further, the constraint condition can constrain an allowable range of at least one of the performances of the tire other than the determined objective function and the design parameters of the tire.

The change of the design variable is effected by: predicting an amount of change in the design variable which gives the optimum value of the objective function while considering the constraint condition based on a sensitivity of the objective function which is a ratio of an amount of change in the objective function to a unit amount of change in the design variable and a sensitivity of the constraint condition which is a ratio of an amount of change in the constraint condition to a unit amount of change in the design variable; calculating a value of the objective function when the design variable is changed to correspond to a predicted amount and a value of the constraint condition when the design variable is changed to correspond to a predicted amount; and changing a value of the design variable to be selected based on the predicted and calculated values until the optimum value of the objective function is given while considering the constraint condition.

The design of a tire based on the design parameter of the tire comprises: defining the design parameters of the tire in the determined corresponding relation as base models to determine a group for selection composed of a plurality of base models; determine said objective function, a design variable, a constraint condition, and an adaptive function which can be evaluated from the objective function for each base model in the group for selection; selecting two base models from the groups for selection; effecting at least one of producing new base models by intersecting the design variables of the selected two base models at a predetermined probability with each other, and producing new base models by modifying in part the design variables of at least one of the two base models; obtaining an objective function, a constraint condition, and an adaptive function of the base model using said conversion system calculation means by changing design variables; storing the base model whose design variables have been changed and a base model whose design variables have not been changed; repeating the storing step until the number of the stored base models reaches a predetermined number; determine whether a new group comprising the stored base models of the predetermined number satisfies a predetermined convergence condition; wherein if not, the new group is defined as the group for selection and the above steps are repeated until the group for selection defined satisfies the predetermined convergence condition; and if the predetermined convergence condition is satisfied, designing a tire based on the design parameter of the tire obtained by the design variable, which gives the optimum value of the objective function, among the predetermined number of the stored base models by using the corresponding relation while considering the constraint condition.

As described above, according to the present invention, since a conversion system in which a non-linear correspondence between design parameters of the shape, structure, and pattern of the tire, and performances of the tire is established is determined by using a neural network, and therefore, the conversion system can be obtained with high accuracy and lesser optionality.

Further, since the design parameters of the shape, structure, and pattern of the tire, which give an optimum value of an objective function is obtained by using the conversion system, and therefore, any optimal solution for an objective function can be obtained in a short time no matter how complex the objective function is.

BRIEF DESCRIPTION OF THE DRAWINGS

FIG. 12(*a*) is a diagram which shows a convex mapping function of a curve type.

FIG. 13 are diagrams which show concave mapping functions.

BEST MODES FOR CARRYING OUT THE INVENTION

Referring now to the attached drawings, embodiments of the present invention will be hereinafter described in detail. An embodiment of the present invention is applied to an optimization apparatus in which an optimum tire design parameter is obtained. In an optimization apparatus of a first embodiment, the design parameter is obtained by optimization calculation using as a conversion system a neural network obtained after being subjected to learning which is a non-linear prediction technique in which a neural circuit network of a higher animal is modeled in an engineering approach.

Figure 1:
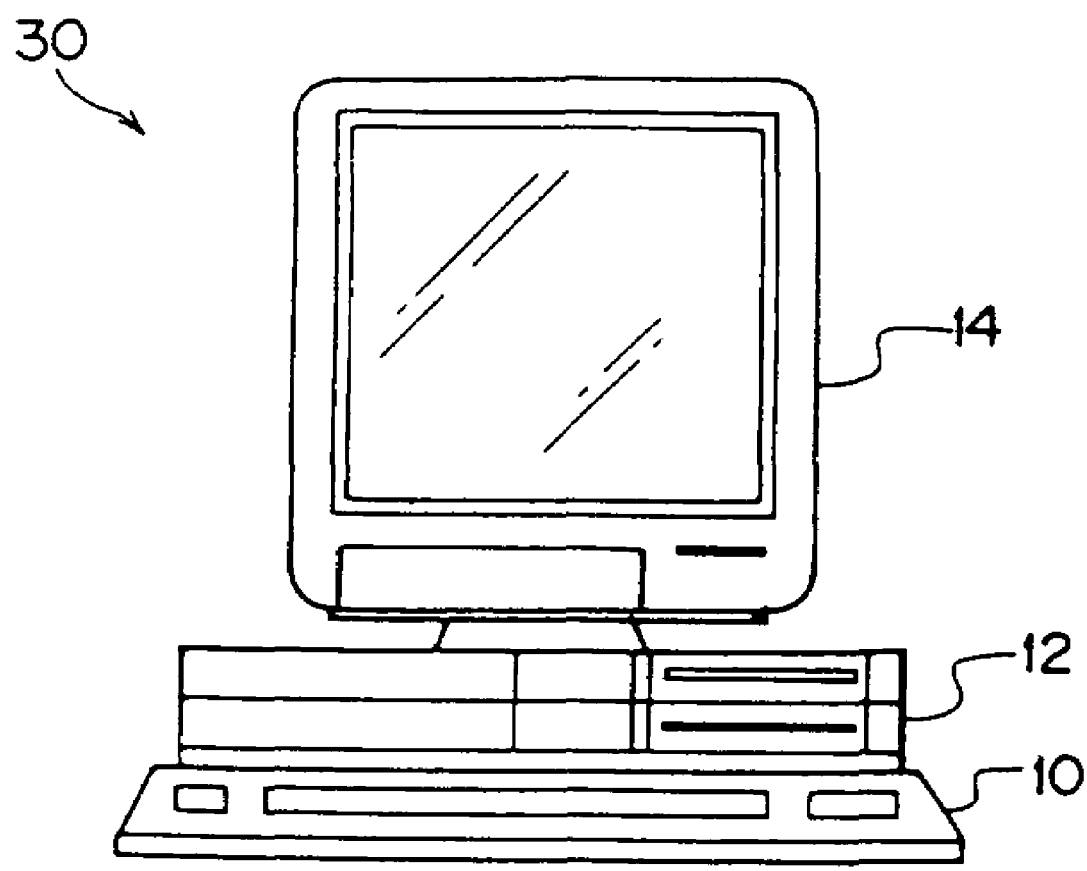
FIG. 1 is an exterior view of an optimization apparatus according to an embodiment of the present invention.

In FIG. 1, an optimization apparatus 30 for executing optimization of the present invention is schematically shown. The optimization apparatus 30 comprises: a keyboard 10 for inputting data or the like; a computer main body 12 which predicts performances of a tire from design parameters of the shape, structure, and pattern of the tire and the like using a neural network by means of a non-linear prediction method in accordance with a program stored in advance and calculates a design variable which satisfies a constraint and optimizes (for example, maximize or minimize) an objective function; and a CRT 14 for displaying calculation results or the like obtained by the computer main body 12.

Figure 2:
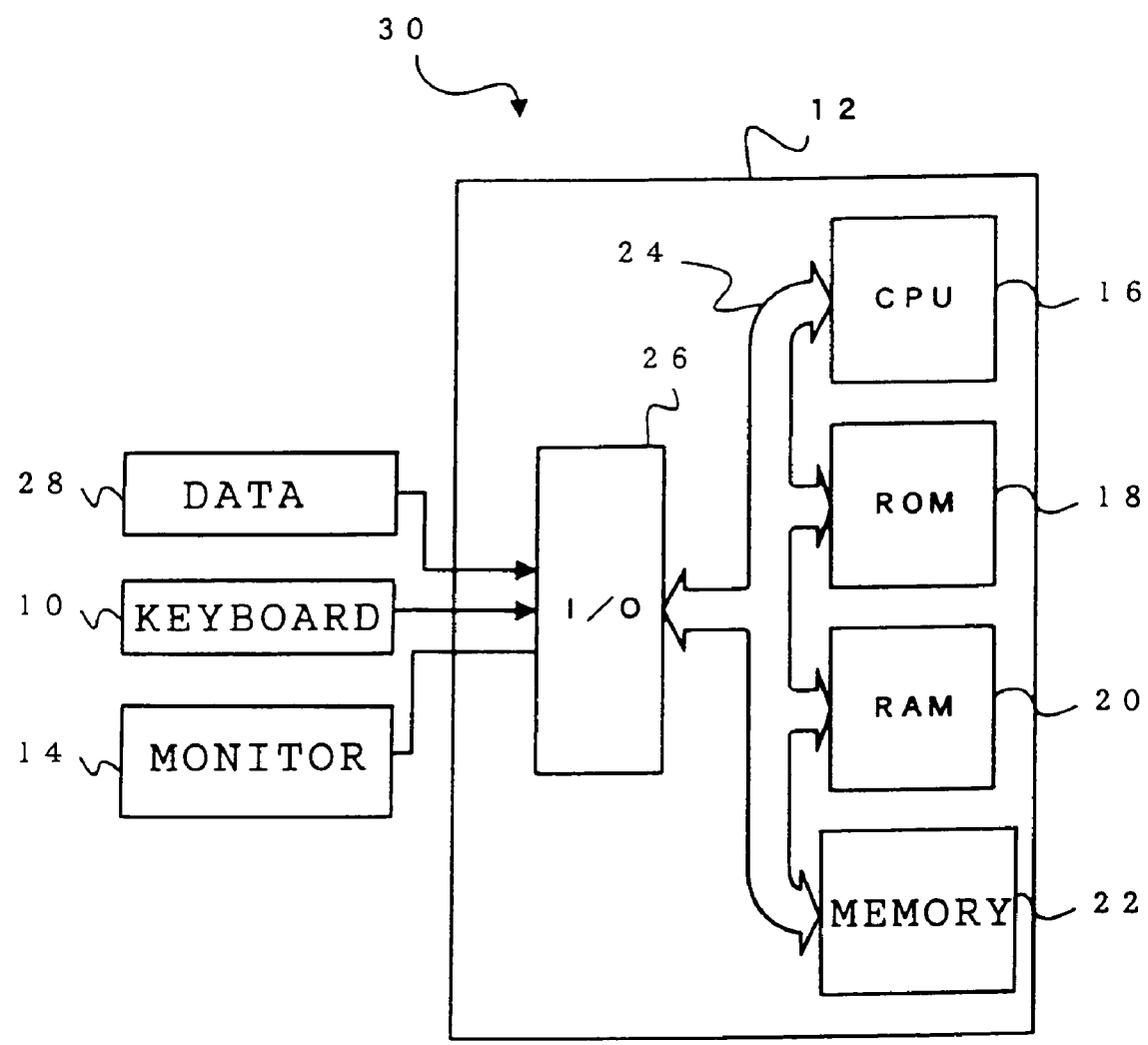
FIG. 2 is a schematic structural view of the optimization apparatus according to the embodiment of the present invention.

As shown in FIG. 2 in detail, the optimization apparatus 30 comprises: the computer main body 12 formed to include a microcomputer, a data input/output unit 28, a keyboard 10 for inputting data and commands; and a monitor 14. The computer main body 12 comprises: a CPU 16; a ROM 18; a RAM 20; a memory 22 which stores a conversion system and the like (described later in detail), an input/output device 26 (hereinafter referred to as I/O) which allows transmission of data and the like between the main body and the other device; and a bus 24 connected so as to enable input/output of data or commands. The ROM 18 stores a processing program which will be described later. The data input/output device 28 is a unit for reading from an exterior storage means when numerically represented design parameters of the shape, structure, and pattern of a tire, manufacturing conditions, and tire performance (in this embodiment, the shape, structure, and pattern of a tire) are stored in the exterior storage means. When the keyboard 10 is used as an input device, the data input/output device 28 is not required.

Figure 3:
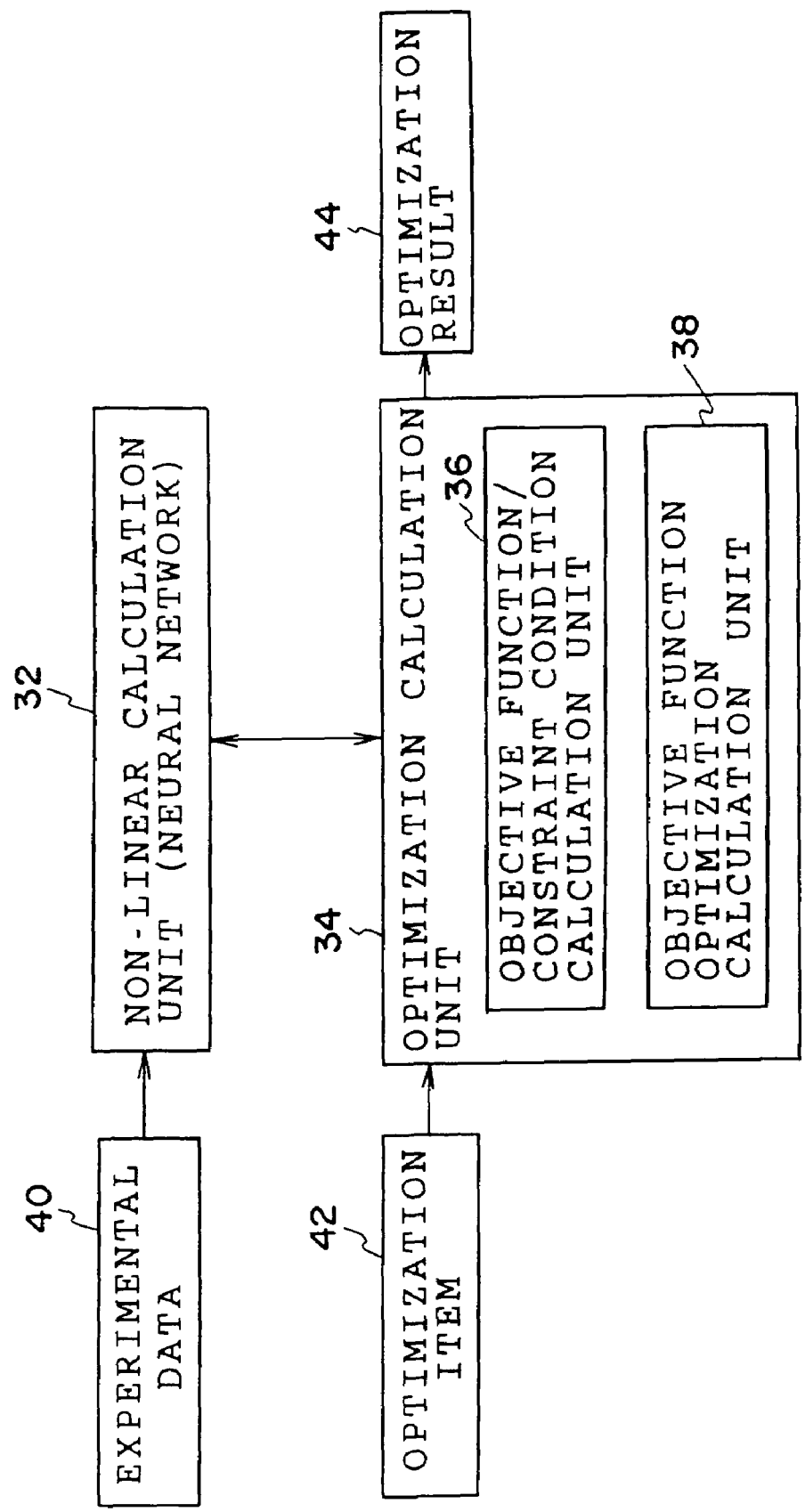
FIG. 3 is a schematic block diagram showing functions of the optimization apparatus according to the embodiment of the present invention.

FIG. 3 is a block diagram which shows functions of the optimization apparatus 30 according to the embodiment of the present invention. The optimization apparatus 30 of the embodiment optimizes a tire performance (which is called an objective function) to be maximized or minimized and outputs a design parameter corresponding to the optimized tire performance.

The optimization apparatus 30 is functionally divided into a non-linear calculation unit 32, an optimization calculation unit 34, an experimental data input unit 40, an optimization item input unit 42, and an optimized result output unit 44. The non-linear calculation unit 32 functions as a calculation unit of a conversion system (described later in detail) comprising a neural network and is used to obtain, based on data inputted from the experimental data input unit 40, a conversion system in which the shape, structure, pattern, and manufacturing condition of a tire, and performances thereof are made to correlate with each other. The conversion system mentioned herein is a conversion system itself which allows conversion and inverse conversion thereof to be made in a one to one corresponding manner between the design parameters of the shape, structure, and pattern of the tire and the manufacturing condition thereof, and the performances of the tire, and when the neural network which has been subjected to learning is represented by a mathematical expression, the conversion system includes the mathematical expression and the coefficients thereof. The experimental data input unit 40 is used to input data of the design parameters of the shape, structure, and pattern of the tire and the manufacturing conditions thereof, and performances corresponding thereto.

The optimization item input unit 42 is used to input the following: (1) a tire performance (which is an objective function later described), such as a predicted or measured physical quantity of a tire which is to be maximized or to be minimized; (2) a predicted or measured physical quantity of a tire on which constraint is placed when maximized or minimized, and design parameters of the shape, structure, pattern of the tire, and manufacturing conditions such as a vulcanizing temperature; (3) ranges in which the design parameters of the shape, structure, pattern of the tire, and the manufacturing condition can be set; and (4) selection of an optimization related method, and parameters to be used when the method is employed.

The above-described method optimization related methods are a mathematical programming, a genetic algorithm and the like, but in this embodiment, an optimization approach according to the mathematical programming is selected.

The optimization calculation unit 34 is used to optimize an objective function until the objective function is converged and comprises an objective function/constraint calculation unit 36 and an objective function optimization calculation unit 38. The objective function/constraint calculation unit 36 is used to predict, by using the conversion system obtained by using the non-linear calculation unit 32, a tire performance from design parameters of the shape, structure, and pattern of a tire and a manufacturing condition thereof. The objective function optimization calculation unit 38 is used to optimize an objective function inputted by the optimization item input unit 42 until it is converged while satisfying the constraint.

The optimization result output unit 44 outputs, as a result of optimization which has been effected by the optimization calculation unit 34, a design parameter of the shape, structure, pattern of the tire and a manufacturing condition, which have been optimized to satisfy an inputted optimization item(s).

In the present embodiment, the non-linear calculation unit 32 is constructed by using a hardware resource shown in FIG. 2 and a software resource, which will be described later, and it has a conversion function constructed by a conceptual neural network, as described later, and a learning function which learns the conversion function. Further, the non-linear calculation unit 32 can be constructed so as to have only a conversion function without a learning function. Namely, as described later, the non-linear calculation unit 32 is used to obtain the conversion system in which a correlation between, on the one hand, design parameters of the shape, structure, and pattern of a tire and manufacturing conditions and, on the other hand, performances are established with each other, but it suffices that conversion may be conducted between, on the one hand, the design parameters of the shape, structure, pattern of the tire and the manufacturing conditions and, on the other hand, the performances. Accordingly, the corresponding relation between, on the one hand, design parameters of the shape, structure, and pattern of a tire and the manufacturing conditions, and on the other hand, the performances is learned in advance in another neural network, a conversion coefficient of the another neural network obtained by learning are input, and the conversion system in which the correlation between the design parameters of the shape, structure, and pattern of a tire and the manufacturing conditions, and on the other hand, the performances is established may be obtained using the conversion coefficient. Namely, with any construction in which a conversion coefficient may be inputted, it suffices that a function is made to do only a conversion between, on the one hand, the design parameters of the shape, structure, pattern of the tire and the manufacturing conditions, and on the other hand, the performances. The correspondence is stored as a look-up table and conversion may be made by referring to the stored look-up table.

The above-described non-linear calculation unit 32 has, as an input layer, neurons of the number corresponding to the number of design parameters of the shape, structure, and pattern of the tire plus the number of manufacturing conditions in order to allow input of respective values of design parameters of the shape, structure, and pattern of the tire and respective values of manufacturing conditions, and the unit has, as an output layer, neurons of the number corresponding to the number of items of tire performances to be predicted, which are related to an objective function or a constraint, with an intermediate layer interposed therebetween. The neurons are connected by synapses to construct a neural network. When the values of design parameters of the shape, structure, pattern of the tire and the values of the manufacturing conditions are inputted after a learning, which will be described below, the non-linear calculation unit 32 outputs performances corresponding to the input. During a learning, known performances corresponding to design parameters of the shape, structure, pattern of the tire and manufacturing conditions are inputted as a teacher, and setting is made so that the values of the design parameters of the shape, structure, pattern of the tire, and the manufacturing conditions respectively correspond to the values of the tire performances according to a magnitude of error differences between the outputted performances and the known performances.

Figure 4:
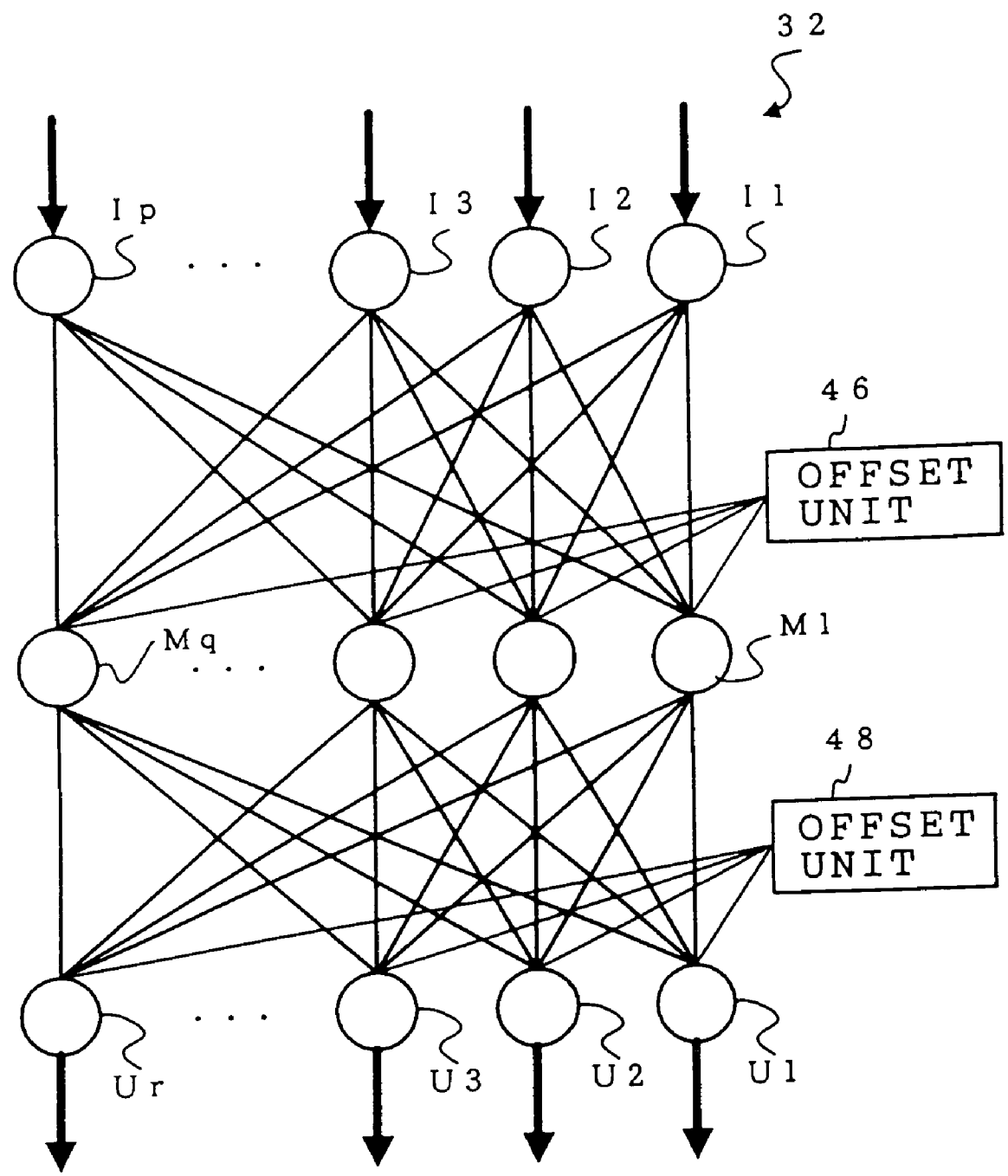
FIG. 4 is a diagram showing a conceptual structure of a neural network.

An example of a neural network used in the non-linear calculation unit 32 is, as shown in FIG. 4, comprised of an input layer having a predetermined number of units I1, I2, . . . , Ip (p>1) corresponding to the number of neurons, an intermediate layer having a large number of units M1, M2, . . . , Mq (q>1), and an output layer having a predetermined number of output units U1, U2, . . . , Ur (r>1). The number of units of the input layer and the number of units of the output layer may be set in accordance with the numbers of design parameters of the shape, structure, pattern of a tire, of manufacturing conditions, and of performances. Each unit of the intermediate layer and each unit of the output layer are respectively connected to offset units 46 and 48 which each offset an output value by a predetermined amount. In the units of the above-described input layer, for example, parameters which represent a belt width, a belt angle, and a belt material of a tire and the shape of the tire, and a cost thereof can be used as input values. In the units of the output layer, for example, rolling resistance, stress-skewness, tire spring characteristics, tire grounding characteristics, and the like can be used as output values.

In the present embodiment, each unit of the intermediate layer and output layer comprises a neural circuit element having sigmoid characteristics in which an input/output relation is represented by a sigmoid function and the unit of the input layer comprises a neural circuit element having a linear input/output relation. Since the above-described units of the intermediate layer and output layer are each constructed to have sigmoid characteristics, the output values thereof each become a real number (a positive number).

The outputs from respective units of the intermediate layer and output layer in the non-linear calculation unit 32 can be represented by the following expressions (1), (2). Namely, assuming that, in a case of a certain unit, the number of synapses of the input side is p, a weight (joint coefficient of units) corresponding to a strength of a synaptic joint is $w_{ji}$ ($1 \leq j \leq N$, $1 \leq i \leq p$), and an input signal is $x_j$, a virtual internal state variable, u, corresponding to an average value of membrane potentials of neurons can be represented by the following expression (1) and an output, y, can be represented in the following expression (2) by a non-linear function, f, which represents characteristics of a neuron.

$$u_j = \sum_{i=1}^{p} w_{ji} \cdot x_i + b_j \qquad (1)$$

$$y_j = f(u_j) \qquad (2),$$

wherein $b_j$ indicates an offset value supplied from an offset unit, and $w_{ji}$ indicates a weight between the i-th unit and the j-th unit of different layers.

Accordingly, by inputting respective values of design parameters of the shape, structure, pattern of a tire, and manufacturing conditions to the units of the input layer, respective values corresponding to the number of tire performances are outputted from the units of the output layer.

The units of the above-described input layer may be each characteristic of outputting an input as it is. A weight of each unit (joint coefficient) of the non-linear calculation unit 32 (neural network) is corrected by learning so that an error is made minimized for a known experimental data in learning processing which will be described later.

Figure 6:
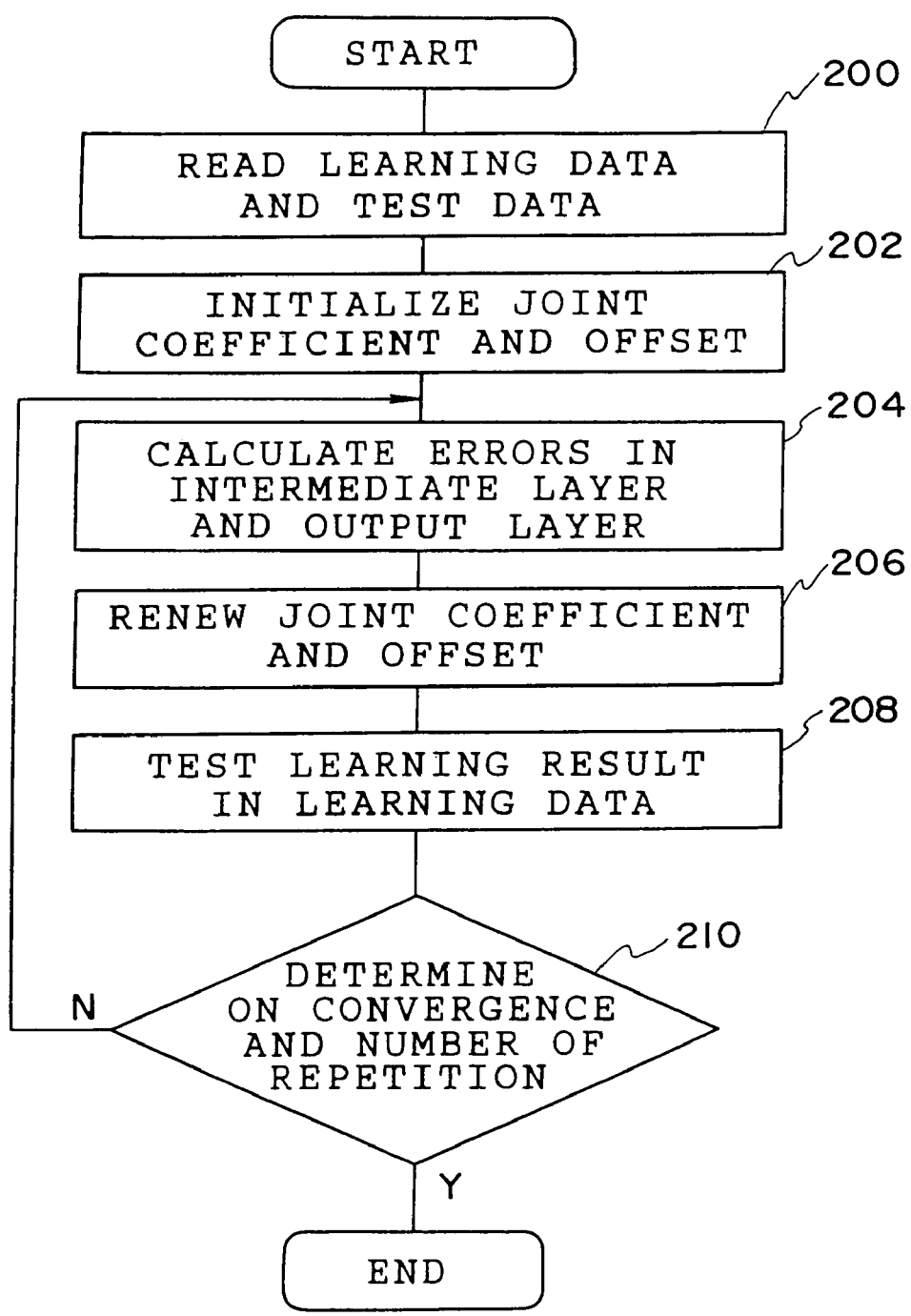
FIG. 6 is a flow chart which shows a flow of a learning process of the neural network.

Next, learning processing of the neural network in the non-linear calculation unit 32 will be described in detail with reference to FIG. 6. In the present embodiment, respective values of design parameters of the shape, structure, pattern of a tire and manufacturing conditions are used for trial manufacture and evaluation of the tire, or for modeling and prediction by computer of the tire, and data relating to the performances of the tire is thereby obtained. Next, the correspondences between, on the one hand, values of the design parameters of the shape, structure, pattern of the tire and the manufacturing conditions, and on the other hand, values which represent the performances of the tire are used as data for the learning process. A predetermined number of data (for example, 90%) among a plurality of data is used as learning data, and the other (for example, 10% as the residual) is used as test data. The reason why the experimental data is used to be divided into data which are used for learning in the neural network and also into data for confirming whether the neural network has optimally learned. Each value of design parameters of the shape, structure, and pattern of the tire and manufacturing conditions is used as input data and each value of performances of the tire is used as output teacher data.

First, in step 200, learning data and test data, which have been obtained, are read. In step 202, initialization is effected by setting in advance joint coefficients (weights) of the units in the neural network and setting offset values to previously set values. In the subsequent step 204, in order to allow the neural network to learn using a plurality of learning data in which design parameters of the shape, structure, pattern of the tire and manufacturing conditions are known, errors in respective units of the intermediate and output layers are obtained.

Errors in the output layer can be differences between the learning data and the tire performances. Errors in the output layer, that is, errors in the units can be minimized by changing little by little at least one of the joint coefficients and the offset values. Further, errors in the intermediate layer can inversely be obtained by a calculation such as an inverse error propagation method with use of the errors in the output layer.

In step 206, the joint coefficients and the offset values which have been obtained are updated (rewritten). In step 208, test data are respectively tested by the updated joint coefficients and offset values in the neural network and data which represents performances of the tire are obtained as values of the test result. In step 210, it is determined whether the values of the test result has been converged according to a judgment about whether the values of the test result obtained in the above-described step 208 are within a predetermined range as a decision reference of convergence, or it is determined whether the above-described operation has been repeated a predetermined number of times. When the decision of step 210 is yes, this routine ends. On the other hand, when the decision of step 210 is no, the process returns to step 204 and the above-described operation is repeated. Accordingly, when the learning data are inputted, respective joint coefficients and offset values are determined such that errors in respective units of the intermediate layer and output layer becomes minimum.

In such a manner as described above, the neural network is made to learn by using a plurality of experimental data in which the design parameters of the shape, structure, pattern of the tire and the manufacturing conditions are known. Namely, learning is conducted so that the errors of the output value from the output layer of the neural network and the teacher signals become minimum. The non-linear calculation unit 32 is provided by learning to output the values which represent the performances of the tire when respective values of the design parameters of the shape, structure, pattern of the tire and the manufacturing conditions are inputted thereto.

After the above-described operation ends and learning of the neural network is sufficiently effected, the structure of the network, i.e., the joint coefficients and the offset values are stored in the memory 18 and a conversion system may be constructed.

In the foregoing, the case was described in which the neural network is used as the non-linear calculation unit 32. However, as shown in the following expression (3), the conversion system which utilizes a response surface methodology in a polynomial can also be used.

$$y = a_0 + \sum_{i=1}^{P} a_i x_i + \sum_{i=1}^{P}\sum_{j=1}^{P} b_{ij} x_i x_j \qquad (3)$$

Figure 5:
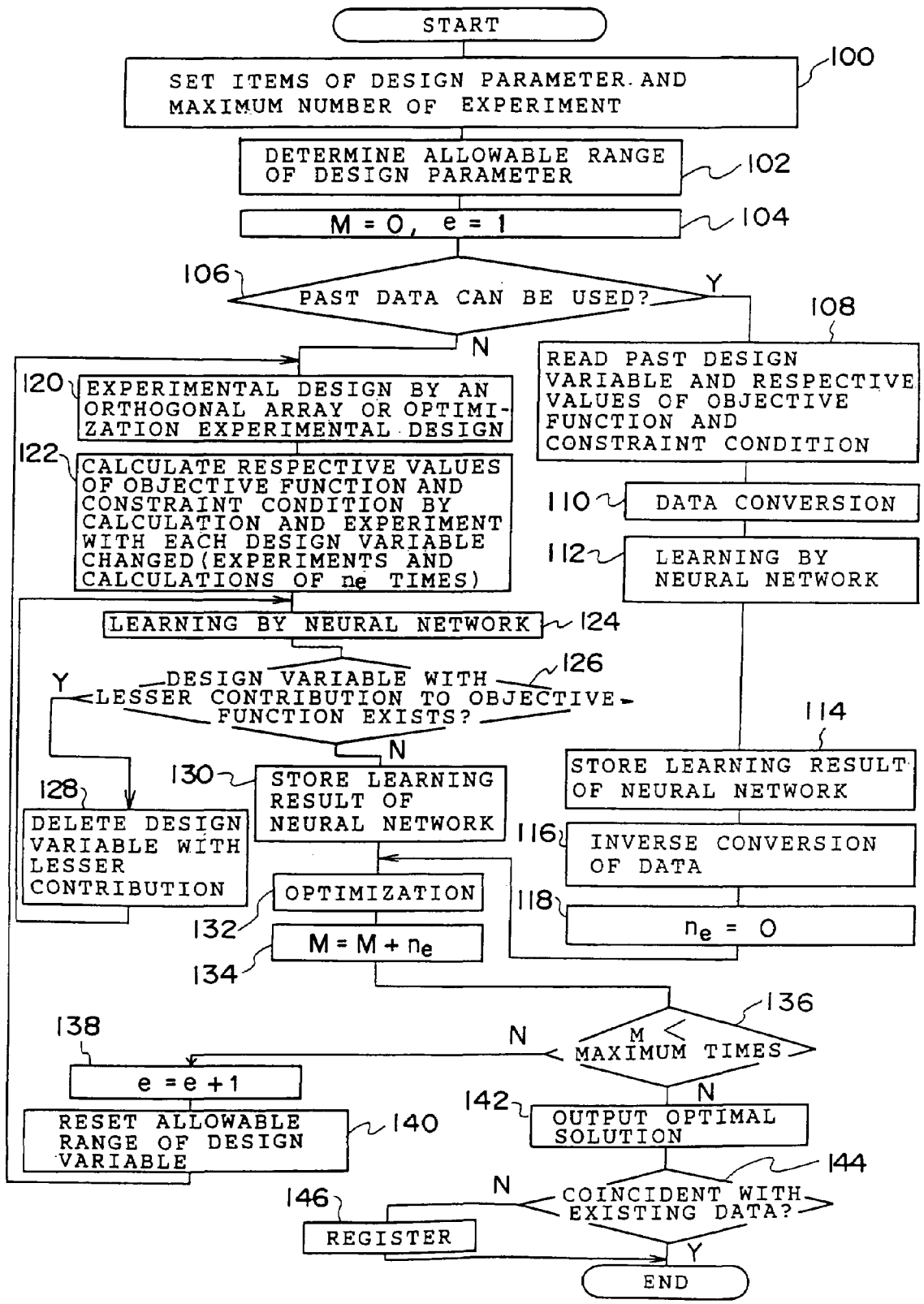
FIG. 5 is a flow chart which shows a flow of operation of the optimization apparatus according to the embodiment of the present invention.

Next, an operation of the optimization apparatus 30 of the embodiment of the present invention will further be described with reference to the flow chart of FIG. 5. When a power source of the optimization apparatus 30 is turned on or an execution starting instruction is given to the optimization apparatus 30 from a keyboard, the process proceeds to step 100 shown in FIG. 5, in which design parameters $x_i$ (i=1 to p) of the shape, structure, pattern of a tire, an objective function, and the maximum number of experiments are set. Namely, it is set about which performance need to be improved. In this case, it is set about how many times of experiments an optimal design parameter of the shape, structure, and pattern of the tire is desired to be determined.

In step 102, an allowable range of the design parameter $x_i$ of the shape, structure, and pattern of the tire which has been set in step 100 is set ($x_i^L \leq x_i \leq x_i^U$: $x_i^L$ is a lower limit value and $x_i^U$ is an upper limit value). In the subsequent step 104, the number M of analysis obtained by experiment or numerical calculation, and a variable, e, which indicates the position of the design parameter of the shape, structure, and pattern of the tire are initialized (M=0, e=1).

In step 106, it is determined whether experimental data in the past can be utilized for the design parameter $x_i$ of the shape, structure, and pattern of a tire, and the performances of the tire which have been set in step 100. When the decision of step 106 is yes, the process proceeds to step 108. Further, when the decision of step 106 is no and experimental data needs to be newly obtained, the process proceeds to step 120.

In step 120, the design parameter of the shape, structure, and pattern of the tire is determined by determining which design parameter $x_i$ of the shape, structure, and pattern thereof is changed for effecting an experiment with use of an orthogonal array, an optimal experimental design or the like. The determination of the design parameter of the shape, structure, and pattern of a tire is made by using a process described in "Box and Draper; Empirical Model Building and Response Surfaces, by John Wiley & Sons, New York".

In the subsequent step 122, a tire is manufactured by way of experiment or numerically modeled by the design parameters of shape, structure, and pattern of the tire according to the experimental design determined in step 120 and an experiment for evaluating performances or numerical analysis is effected to obtain data. The number of times of total experiment or the number of times of numerical analysis at this time is indicated by $n_e$.

In step 124, in the same way as described above, learning of the neural network is effected. Namely, the learning is effected with respective values of design parameters of the shape, structure, and pattern of a tire being used as the values inputted to the input layer and with respective values of tire performances being used the values outputted from the output layer.

In the subsequent step 126, a determination is made about whether there is any design parameter of the shape, structure, and pattern of the tire, which contributes to the target physical property and characteristic at a lesser extent. For example, by calculating a sensitivity which shows a tendency of change in the tire performance in the output layer with respect to a small change in a design parameter $x_i$ of the shape, structure, and pattern of the tire inputted to at least one of units of the input layer, and a degree of reduction in predicted precision of a tire performance of the output layer when an output from at least one of units of the input layer set at zero, the design parameter of the shape, structure, and pattern of the tire having a lesser contribution is determined. The reason is that the design parameter of the shape, structure, and pattern of the tire, whose sensitivity is small and whose input can be neglected without a reduction in prediction precision, is considered to have a lesser contribution.

When there is a design parameter of the shape, structure, and pattern of the tire having a lesser contribution, the decision of step 126 is made affirmative. In step 128, the design parameter $x_i$ of the shape, structure, and pattern of the tire having a lesser contribution is deleted, and the other design parameters of the shape, structure, and pattern of the tire after the deletion are used to conduct a second learning (step 124). On the other hand, when no design parameter of the shape, structure, and pattern of the tire having a lesser contribution exists, the decision of step 126 is made negative. In step 130, a correlation between the input layer (design parameters of the shape, structure, and pattern of the tire) of the neural network which has been subjected to learning and the output layer (tire performances) is stored. Namely, a joint coefficient and an offset value are stored.

Figure 7:
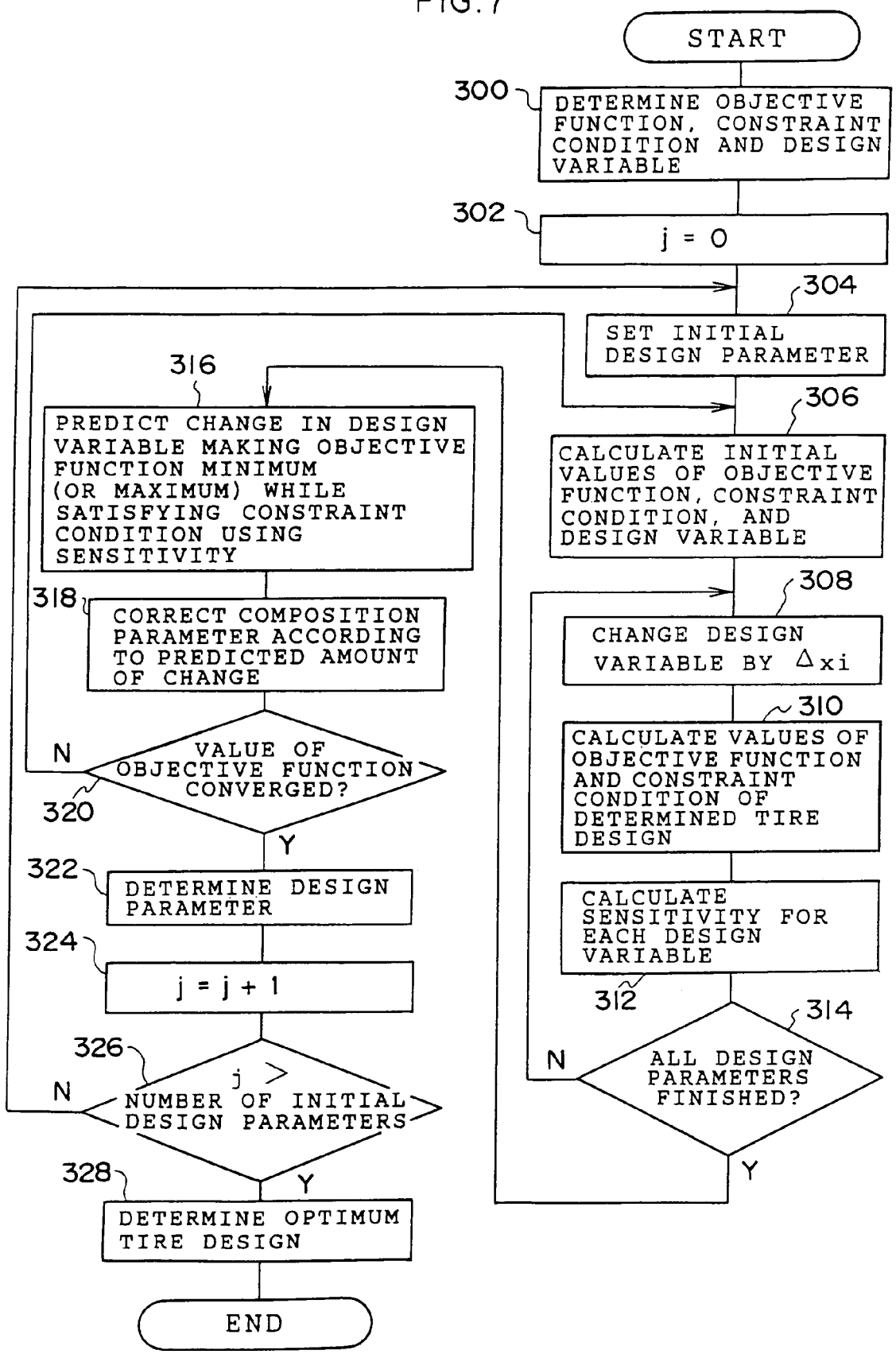
FIG. 7 is a flow chart which shows a flow of an optimization process of a first embodiment of the present invention.
Figure 8:
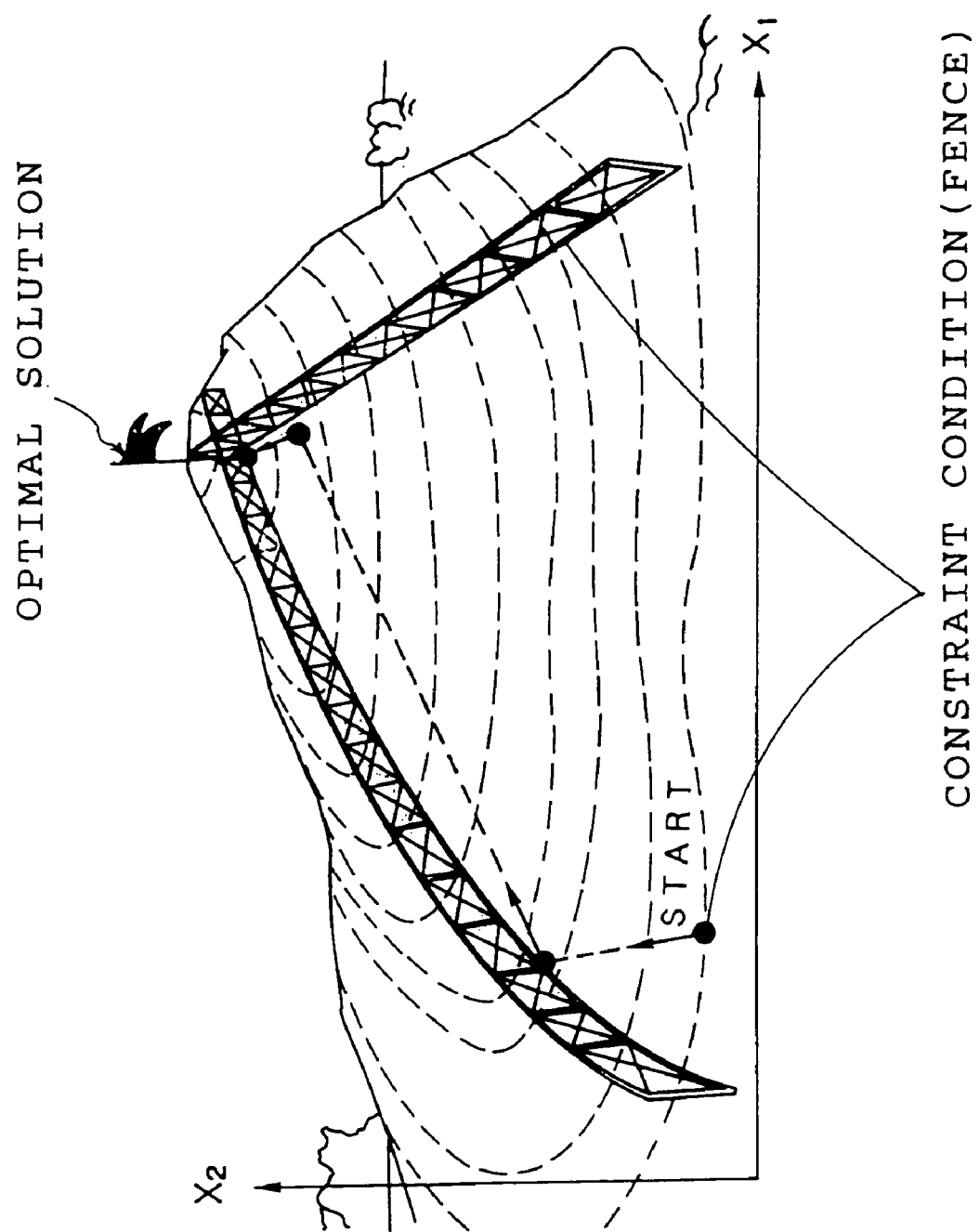
FIG. 8 is a conceptual diagram showing an image for illustrating an optimization of the present invention.
Figure 9:
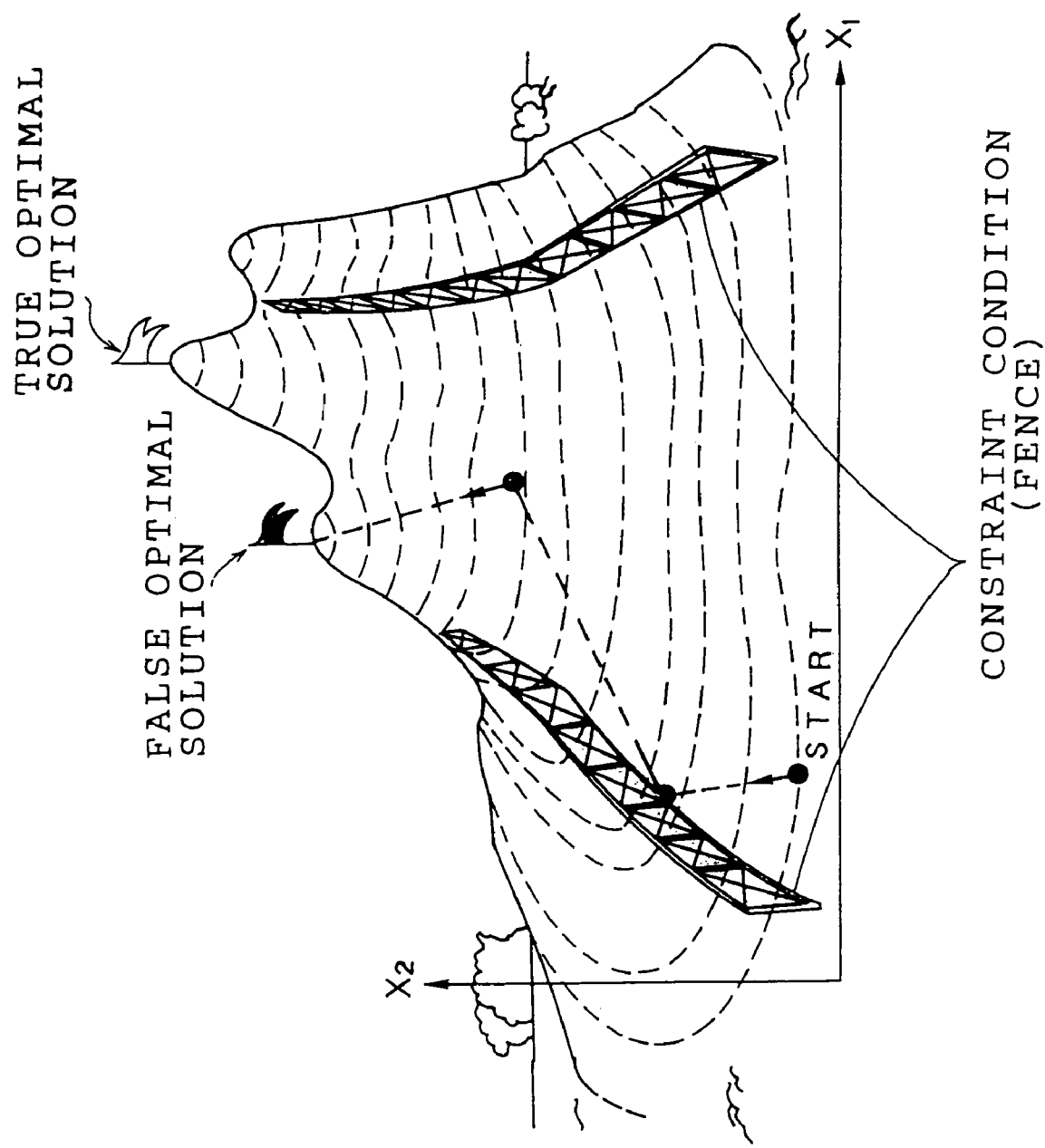
FIG. 9 is a conceptual diagram showing another image for illustrating an optimization of the present invention.

In the subsequent step 132, the best design parameter $x_i$ of the shape, construction, and pattern of the tire is obtained by optimization of an objective function in such a manner as to, as described later, use the correlation between the stored input layer (design parameters of the shape, structure, and pattern of the tire) and the stored output layer (tire performances) (see FIG. 7).

When the optimization is completed, the number of times of experiment or the number of times of analysis, M, is increased so that M=M+$n_e$ in step 134. In step 136, it is determined whether M<(the maximum set number of times of experiment or analysis). When an M is smaller than the maximum set number, the process proceeds to step 138.

In step 138, a variable, e, is incremented. In step 140, the allowable ranges of design parameters of the shape, structure, and pattern of the tire are reset as shown in the following expressions (4), (5), and (6) and the process returns to step 120. By effecting this processing repeatedly, the precision of an optimum design parameter $x_i^{OPT}$ of the shape, structure, and pattern of a tire can be improved. Resetting of the allowable ranges in step 140 is effected by making narrower ranges than those of the design parameters of the shape, structure, and pattern of the tire determined in step 102, and in step 120, design of second experiment is conducted for the narrowed ranges.

$$x_i^{Lnew} \leq x_i - x_i^{Unew} \quad (4)$$

$$x_i L_{new} = \operatorname{Min}\left[x_i^L, x_i^{OPT} - \frac{x_i^U - x_i^L}{NN}\right] \quad (5)$$

$$x_i U_{new} = \operatorname{Max}\left[x_i^U, x_i^{OPT} - \frac{x_i^U - x_i^L}{NN}\right], \quad (6)$$

wherein NN is a coefficient to determine a degree at which an allowable range of a design parameter of the shape, structure, and pattern of the tire is made narrower. It is preferable that NN is set in the range of 1.5 to 5.

On the other hand, when the decision of step 136 is no, i.e., when the number of times of experiment or numerical analysis is larger than the predetermined maximum number of times of experiment or numerical analysis, the design parameter of the shape, structure, and pattern of the tire obtained finally in step 142 is outputted as the optimum tire design. In step 144, it is determined whether a similar experiment or numerical analysis exists in the past experimental data. When the decision of step 144 is no, in step 146, a performance of the optimum tire design is entered into a data base such as an external storage device or the like via the memory 22 or the data input/output unit 28. Here, a second group of experiments or numerical analysis may be executed to obtain a performance of a tire.

The maximum number of times of experiment or numerical analysis is a constant which is determined based on a cost required for experiments or numerical analysis, a time required for obtaining the optimum tire design, and the like.

When the decision of step 106 is yes, in step 108, design parameters of the shape, structure, and pattern of a tire in the past associated with items set in step 100 are read from a previously prepared data base. In the subsequent step 110, the read data are converted so as to have a smaller kurtosis and skewness by using the following expressions (7), (8), (9), and (10).

$$\operatorname{Kurtosis} = \frac{1}{p}\sum_{i=1}^{p}\left(\frac{c_i - \mu}{\sigma}\right)^4 - 3 \quad (7)$$

$$\operatorname{Skewness} = \frac{1}{p}\sum_{i=1}^{p}\left(\frac{c_i - \mu}{\sigma}\right)^3 \quad (8)$$

$$\mu = \frac{1}{p}\sum_{i=1}^{p}c_i \quad (9)$$

$$\sigma = \frac{1}{p}\sum_{i=1}^{p}(c_i - \mu)^2 \quad (10)$$

In step 112, learning of the neural network is effected in the same way as in step 124. In step 114, a result of the learning is stored as in step 130. In step 116, an inverse conversion which is inverse to the conversion in step 110 is effected in order to return to the experimental data. In step 118, the total number of experiments, $n_e$, is reset (=0) and the process proceeds to step 132.

Next, optimization processing in step 132 shown in FIG. 5 will be described in detail. In step 300 shown in FIG. 7, there are determined an objective function which represents tire performances to be improved, a constraint condition which constrains tire performances which are not allowed to be deteriorated in an improvement of a certain tire performance, and a design variable which determines design parameters of the shape, structure, and pattern of the tire. In the subsequent step 302, a variable, j, which indicates the number of design parameters of the shape, structure, and pattern of the tire is reset (=0).

In step 304, a design parameter of the shape, structure, and pattern of the tire, which is used as an initial value when optimization is set. In optimization of design of the shape, structure, and pattern of a tire, a solution space for an optimal solution is required to be obtained by conducting optimization starting from a different initial value, since a design space relating to tire performances has a multi-peak configuration if an input value is taken in a three dimensional image by plotting input values (for example, width and angle of a belt) on a plane, which is two dimensional, and further plotting an objective function along a heightwise direction. As an initial value, for example, the following expression (11) can be employed.

$$x_i^{start} = x_i^L + \frac{x_i^U - x_i^L}{Munit} \cdot k, \quad (11)$$

wherein $x_i$ (i=1 to p) is a design parameter of the shape, structure, and pattern of a tire, $x_i^L \leq x_i < x_i^U$ is a range in which a design parameter of the shape, structure, and pattern of the tire can be set, k=0 to Munit which is the number of divisions of an allowable range of a design parameter of the shape, structure, and pattern of the tire.

In step 306, output by the neural network is executed with the initial design parameter of the shape, structure, and pattern of a tire, which is set in step 304, being used as an input, and a tire performance corresponding to the inputted design parameter of the shape, structure, and pattern of a tire is predicted. An objective function and a constraint condition are calculated by using the result of the prediction.

In step 308, the design parameter $x_i$ of the shape, structure, and pattern of the tire, which has been set in step 304, is changed by $\Delta x_i$ at each time so as to change the design parameter of the shape, structure, and pattern of the tire. In step 310, a value of the objective function $OBJ_j$ and a value of a constraint condition $G_i$ after a design variable is changed by $\Delta x_i$ are calculated. In step 312, a sensitivity of the objective function, $dOBJ/dx_i$, which is the ratio of a variation of the objective function to a unit variation of a design variable and a sensitivity of a constraint condition, $dG/dx_i$, which is the ratio of a variation of the constraint condition to a unit variation of a design variable are calculated for each design variable in accordance with the following expressions (12) and (13).

$$\frac{dOBJ}{dx_i} = \frac{OBJ_i - OBJ_o}{\Delta x_i} = \frac{OBJ(x_i + \Delta x_i) - OBJ(x_i)}{(x_i + \Delta x_i) - (x_i)} \quad (12)$$

$$\frac{dG}{dx_i} = \frac{G_i - G_o}{\Delta x_i} \quad (13)$$

Due to the sensitivities, it is possible to predict the degree at which a value of the objective function is changed when the design variable is changed by $\Delta x_i$. The prediction process, i.e., an optimization process can be made analogous to mountain climbing and prediction of a change in the value of the objective function corresponds to designation of a direction of climbing a mountain.

In step 314, it is determined whether calculation for all design parameters of the shape, structure, and pattern of the tire is completed. When the calculation is not completed, steps 308 to 312 are executed repeatedly.

In step 316, a variation in the design variable which minimizes (or maximizes) the objective function is predicted while the constraint condition is being satisfied by a mathematical programming method with use of sensitivities of an objective function and a constraint condition. With the predicted value of the design variable used in step 318, each design parameter of the shape, structure, and pattern of the tire is corrected and values of the objective function are calculated based on the corrected design parameters of the shape, structure, and pattern of the tires. In step 320, it is determined whether the value of objective function is converged by comparing a difference between a value of the objective function OBJ calculated in step 318 and an initial value $OBJ_0$ of the objective function calculated in step 306 with a threshold value inputted in advance. When the value of the objective function is not converged, steps 306 to step 320 are executed repeatedly with a value of the design variable obtained in step 316 used as an initial value. When it is determined that a value of the design variable has been converged, a value of the design variable thus obtained is regarded as a value of the design variable which makes the objective function the best while satisfying the constraint condition. In step 322, a design parameter of the shape, structure, and pattern of a tire is determined by using the value of the design variable. In step 324, the variable, j, is incremented and the process proceeds to step 326.

In step 326, it is determined whether variable, j, exceeds an allowable number of initial design parameters of the shape, structure, and pattern of a tire: $(1+Munit)^P$. When j does not exceed the allowable number, the process returns to step 304, and with values of the initial design parameters of the shape, structure, and pattern of the tire being varied, steps 304 to 326 are executed repeatedly.

On the other hand, when the decision of step 326 is yes, in the subsequent step 328, the optimum tire design is determined and the routine ends. The determination of the optimum tire design in step 328 is made in consideration of the following two conditions and the optimum tire design is determined so as to have a larger degree of coincidence with respect to a condition.

The conditions are that:

(1) the objective function OBJ has a small value, wherein tire performances selected as an objective function, which is smaller, is set and if a larger one is better, the larger value is set with a negative sign attached before the same larger value; and (2) even if a design parameter of the shape, structure, and pattern of a tire is changed a little in the vicinity of an obtained optimal solution, neither the objective function nor the constraint condition is changed so much.

As described above, the present embodiment is constructed such that, in order to determine the conversion system, learning of a corresponding relation between, on the one hand, design parameters of the shape, structure, pattern of the tire and manufacturing conditions, and on the other hand, performances of a tire by the neural network is conducted by using experimental or numerically analytic data in the non-linear calculation unit. For this reason, it is not necessary to assume a functional form as means for calculating the conversion system, in which a corresponding relation between, on the one hand, design parameters of the shape, structure, and pattern of a tire and manufacturing conditions, and on the other hand, performances of a tire can be found, can be formed with high accuracy and a lesser optionality. Further, with the conversion system and the optimization calculation unit being combined, a scheme of an optimum design of the shape, structure, and pattern of a tire, which is effective, can be outputted.

Next, a second embodiment of the present invention will be described. This embodiment is provided to effect optimization by a genetic algorithm instead of the sensitivity analysis (FIG. 7) in the above embodiment. This embodiment has almost the same structure as that of the above-described embodiment, and therefore, the same members as those of the above-described embodiment will be denoted by the same reference numerals, and a detailed description thereof will be omitted.

Figure 10:
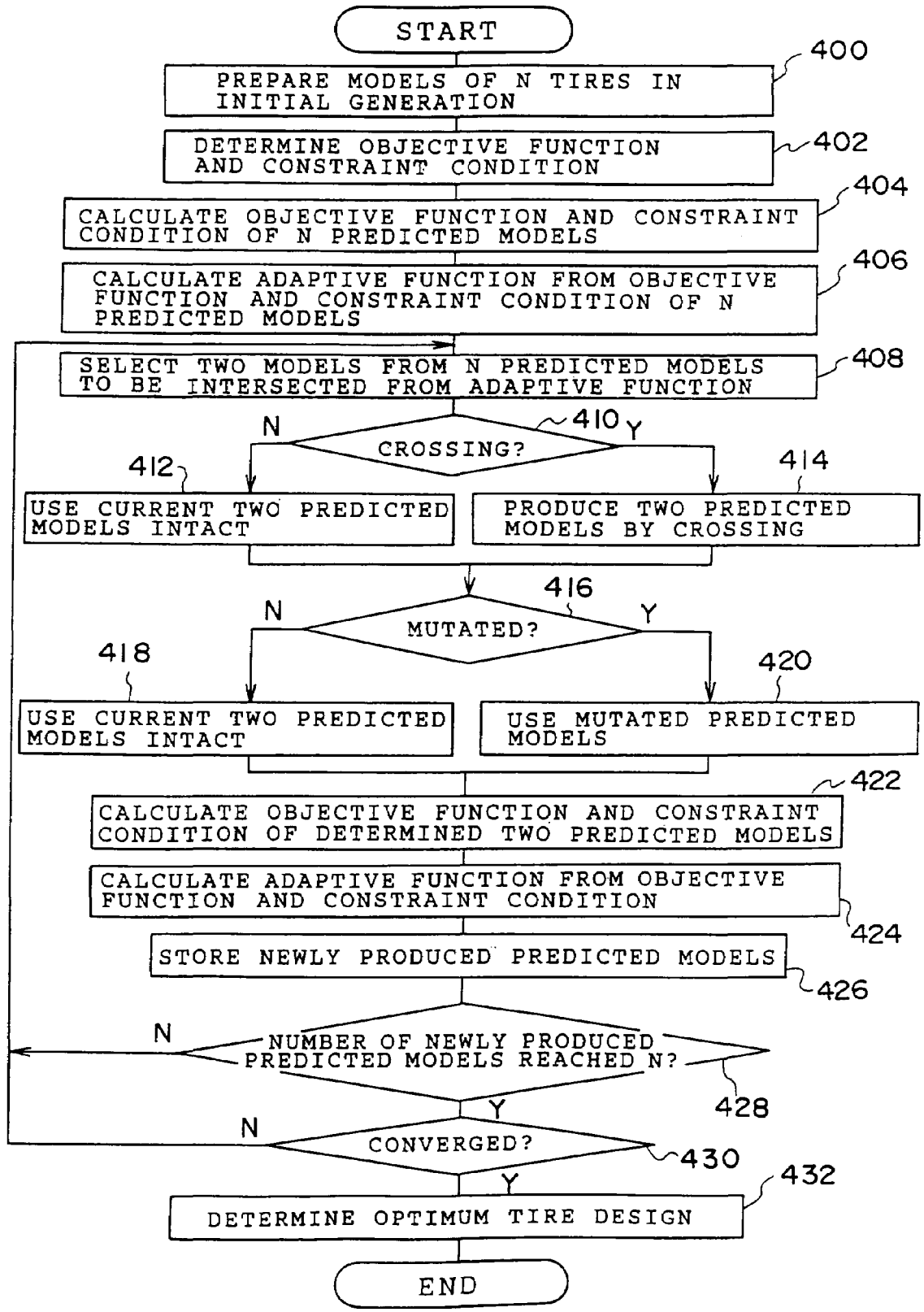
FIG. 10 is a flow chart which shows a flow of an optimization process of a second embodiment of the present invention.

FIG. 10 shows a processing routine of an optimization processing program of the second embodiment. After step 132 shown in FIG. 5 is executed, the processing routine shown in FIG. 10 is executed. In step 400, modeling of N tires is effected. The modeling is effected based on a corresponding relation between design parameters $x_{ij}$(i=1 to p, j=1 to N) of the shape, structure, pattern of a tire, and a tire performance. The modelings of N times means production of N inputs I1 to Ip based on random numbers which are to be inputted to the input layer of the neural network shown in FIG. 4, wherein N is in advance inputted by an operator.

In step 402, an objective function and a constraint condition are determined. Namely, a design variable is set which determines an objective function which represents tire performances to be improved or newly desired, and a constraint condition which constrains deterioration of a tire performance which is not allowed to be deteriorated in the improvement of a certain tire performance (determination of an objective function OBJ and a constraint condition G). In step 404, objective functions $OBJ_J$ and constraint conditions $G_J$ for respective design variables $r_{i,J}$ of N models are calculated.

In step 406, with respective objective functions $OBJ_J$ and constraint conditions $G_J$ of N models obtained in step 404 used, an adaptive function $F_J$ of each of N models is calculated in accordance with the following expression (14). In this embodiment, for example, in order to optimize a tire performance and a cost, a value of the adaptive function (degree of adaptability) becomes larger as a value of the objective function $OBJ_J$ becomes larger and a value of the constraint condition $G_J$ becomes smaller.

$$\Phi_J = -OBJ_J + \gamma \cdot \max(G_J, 0)$$

$$F_J = -\Phi_J \quad (14)$$

or $$F_J = 1/\Phi_J$$

or $$F_J = -a \cdot \Phi_J + b$$

wherein, $a = \dfrac{\Phi_{avg}(c-1)}{(\Phi_{avg} - \Phi_{min})}$ $b = \dfrac{\Phi_{avg}(c - \Phi_{min})}{(\Phi_{avg} - \Phi_{min})}$ $\Phi_{avg} = \dfrac{\sum_{J=1}^{N} \Phi_J}{N}$, wherein c is a constant, $\gamma$ is a penalty factor, $\Phi_{min}$=min$(\Phi_1, \Phi_2, \ldots \Phi_N)$, $\Phi_J$ is a penalty factor of the J-th model among the N models, wherein J=1, 2, 3, . . . N, and c and $\gamma$ are inputted by an operator in advance.

In step 408, two models which intersect each other are selected from N models. With a generally known adaptability proportional strategy used as a selecting method, a probability $P_L$ at which a certain individual l is selected among N models is represented by the following expression.

$$P_L = \dfrac{F_L}{\sum_{J=1}^{N} F_J},$$

wherein $F_L$ is an adaptive function of a certain individual l among the N models and $F_J$ is an adaptive function of the J-th model of the N models, where J=1, 2, 3, . . . N.

In the present embodiment, while the adaptability proportional strategy is used as the selecting method, there may be used an alternative such as an expected value strategy, a rank strategy, an elite conserving strategy, tournament selection strategy, a GENITOR algorithm, or the like, as shown in a book titled "Genetic Algorithm" compiled by Hiroaki Kitano.

In step 410, it is determined whether two selected models are caused to intersect each other at a probability T inputted by the operator in advance. The intersection mentioned herein a means that the two models partially exchange for each other in elements constituting themselves, as described later. When the decision of step 410 is no, that is, when the two models are not caused to intersect each other, in step 412, the two models are kept intact and the process proceeds to step 416. On the other hand, when the decision of step 410 is yes, the two models are caused to intersect each other in step 414 as described later.

Figure 11:
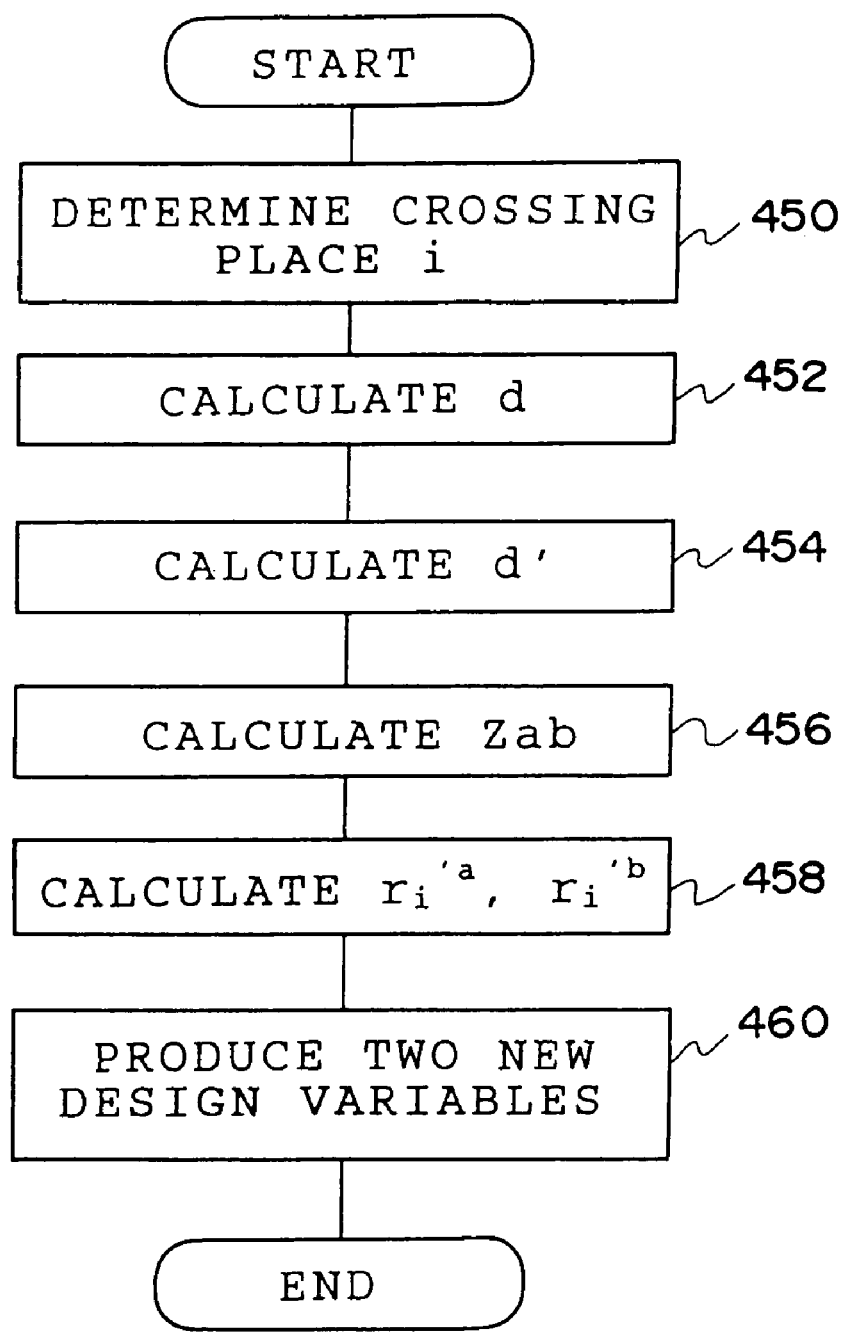
FIG. 11 is a flow chart which shows a flow of an intersecting process.

Intersection of the two models is effected by an intersection routine shown in FIG. 11. First, in step 408 shown in FIG. 10, the two selected models are respectively named as model "a" and model "b" and the design variables of the models "a" and "b" are expressed by design variable vectors including a list, wherein a design variable vector $Vr^a$ of the model "a" is $Vr^a = (r_1^a, r_2^a, \ldots, r_i^a, \ldots, r_{n-1}^a)$ and a design variable vector $Vr_b$ of the model "b" is $Vr^b = (r_1^b, r_2^b, \ldots, r_i^b, \ldots, r_{n-1}^b)$. In step 450 shown in FIG. 11, with random numbers being produced in advance, an intersection place, i, regarding the design variable vectors of the models "a" and "b" are determined according to the random numbers.

In step 452, a distance, d, is obtained, by the following expression, for the design variables $r_i^a$ and $r_i^b$ of the models "a", "b" which have been determined to be subjected to intersection.

$$d = |r_i^a - r_i^b|$$

In step 454, by using the minimum value $B_L$ and the maximum value $B_u$ in the ranges in which $r_i^a$ and $r_i^b$ can be set respectively, a normalized distance d' is obtained by the following expression.

$$d' = \dfrac{d}{B_u - B_L}$$

Figure 12A:
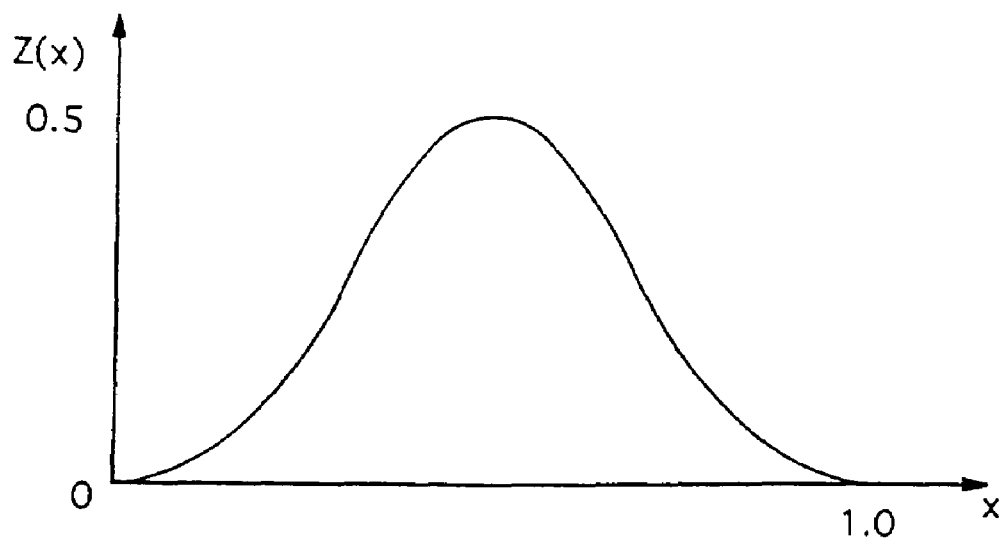
FIG. 12 are diagrams which show convex mapping functions.
FIG. 12(b) is a diagram which shows a convex mapping function of a linear type.
Figure 12B:
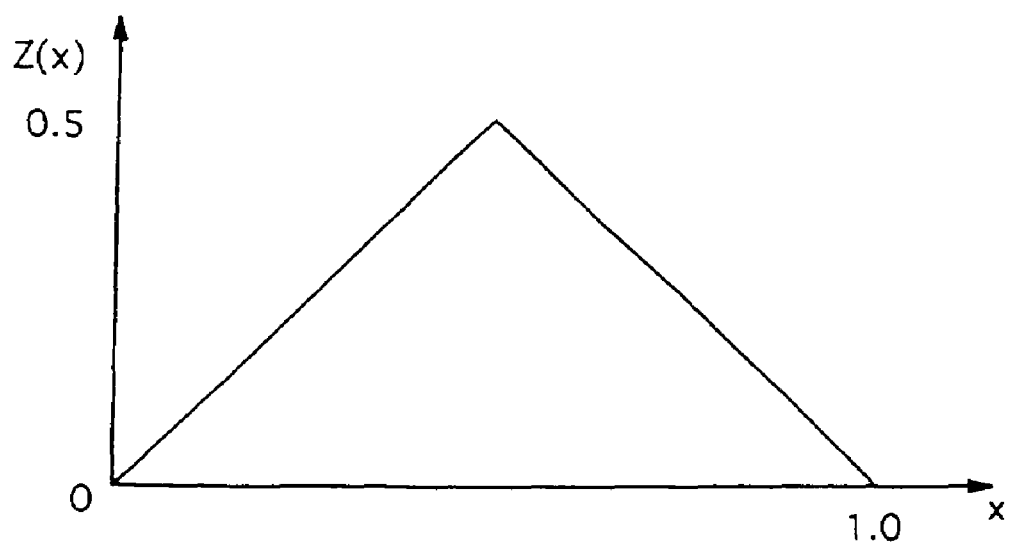

In step 456, a function value $Z_{ab}$ is obtained in accordance with the following expression by using a mapping function of a dome type Z(x) (0≤1, 0≤Z(x)≤0.5) as shown in FIGS. 12(a) and 12(b) in order to properly disperse values of normalized distances d'.

$$Z_{ab} = Z(d')$$

After the function value $Z_{ab}$ is obtained as described above, new design variables $r_i'^a$, $r_i'^b$ are obtained in accordance with the following expressions in step 458.

$$r_i'^a = r_i^a - \frac{\min(|r_i^a - B_L|, |r_i^a - Bu|)}{0.5} \cdot Z_{ab}$$

$$r_i'^b = r_i^b + \frac{\min(|r_i^b - B_L|, |r_i^a - Bu|)}{0.5} \cdot Z_{ab}$$

or $$r_i'^a = r_i^a + \frac{\min(|r_i^a - B_L|, |r_i^a - Bu|)}{0.5} \cdot Z_{ab}$$

$$r_i'^b = r_i^b - \frac{\min(|r_i^b - B_L|, |r_i^a - Bu|)}{0.5} \cdot Z_{ab}$$

After $r_i'^a$, $r_i'^b$ are obtained as described above, in step 460, design variable vectors $V_r'^a$, $V_r'^b$ which are lists of the new design variable are obtained in such a way as described below.

$$V_r'^a = (r_1^a, r_2^a, \ldots, r_i'^a, r_i'^b, \ldots, r_{n-1}^b)$$

$$V_r'^b = (r_1^b, r_2^b, \ldots, r_i'^b, r_{i+1}^a, \ldots, r_{n-1}^a)$$

Figure 13A:
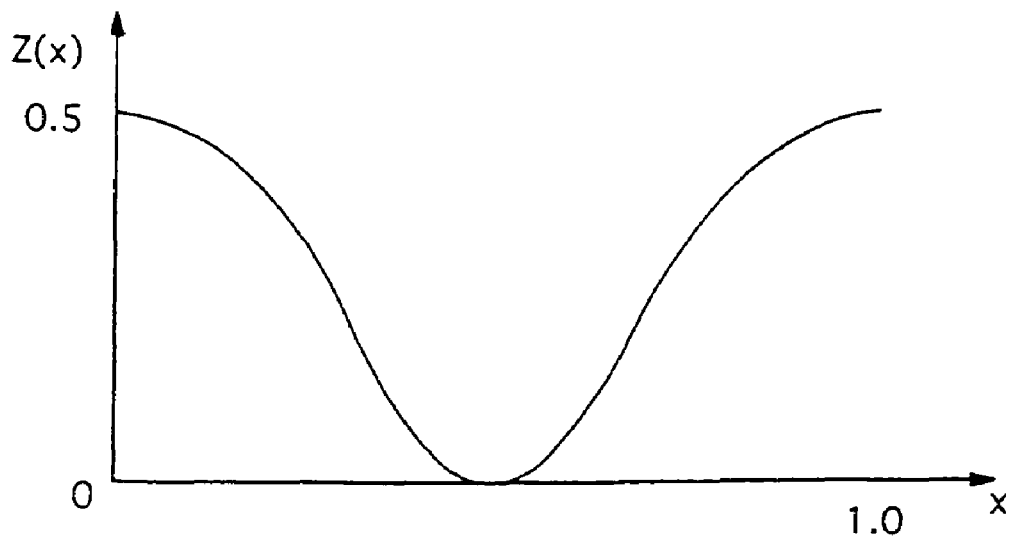
FIG. 13(a) is a diagram which shows a concave mapping function of a curve type.
Figure 13B:
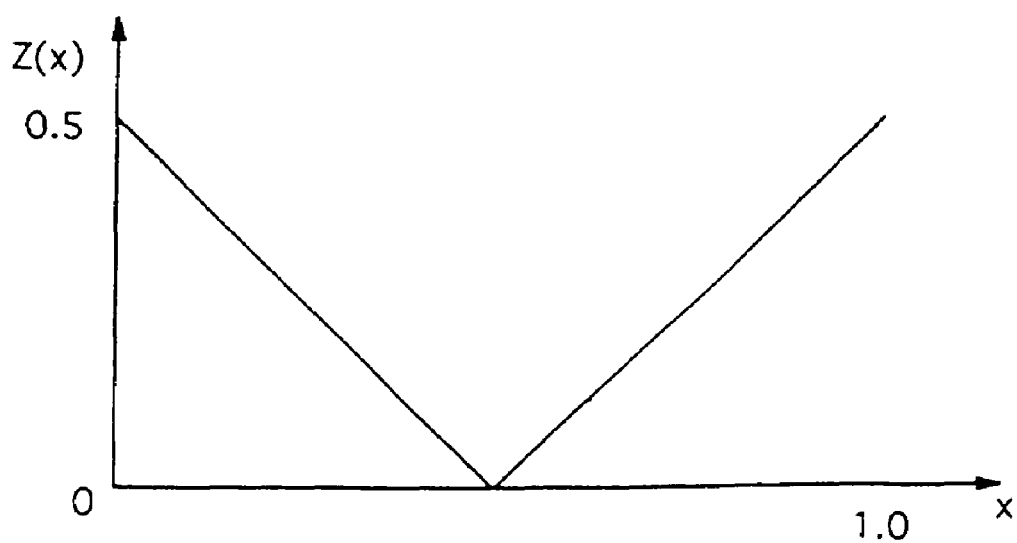
FIG. 13(b) is a diagram which shows a concave mapping function of a linear type.

Meanwhile, the minimum value $B_L$ and the maximum value Bu in the range in which $r_i$ can be set are previously inputted by an operator. Further, a mapping function Z(x) may be a mapping function of a valley type as shown in FIGS. 13(a), 13(b). In the foregoing, although the number of an intersection place, i, is set at only one, a plurality of intersection points, a uniform intersection or the like may be employed as shown in a book titled "Genetic Algorithm" compiled by Hiroaki Kitano.

After two new models are produced by such an intersection, in step 416 shown in FIG. 10, it is determined whether mutation is made to occur at a probability S previously inputted by the operator. The mutation mentioned herein is to change a portion of a design variable by a very small amount, which is effected in order to achieve a higher probability with which a population, which can be an optimum design variable, is included. When the decision of step 416 is no, that is, when mutation is not made to occur, the current two models are kept intact in step 426 and the process proceeds to step 422. When the decision of step 416 is yes and mutation is made to occur, mutation processing is effected in step 420 as described below.

Figure 14:
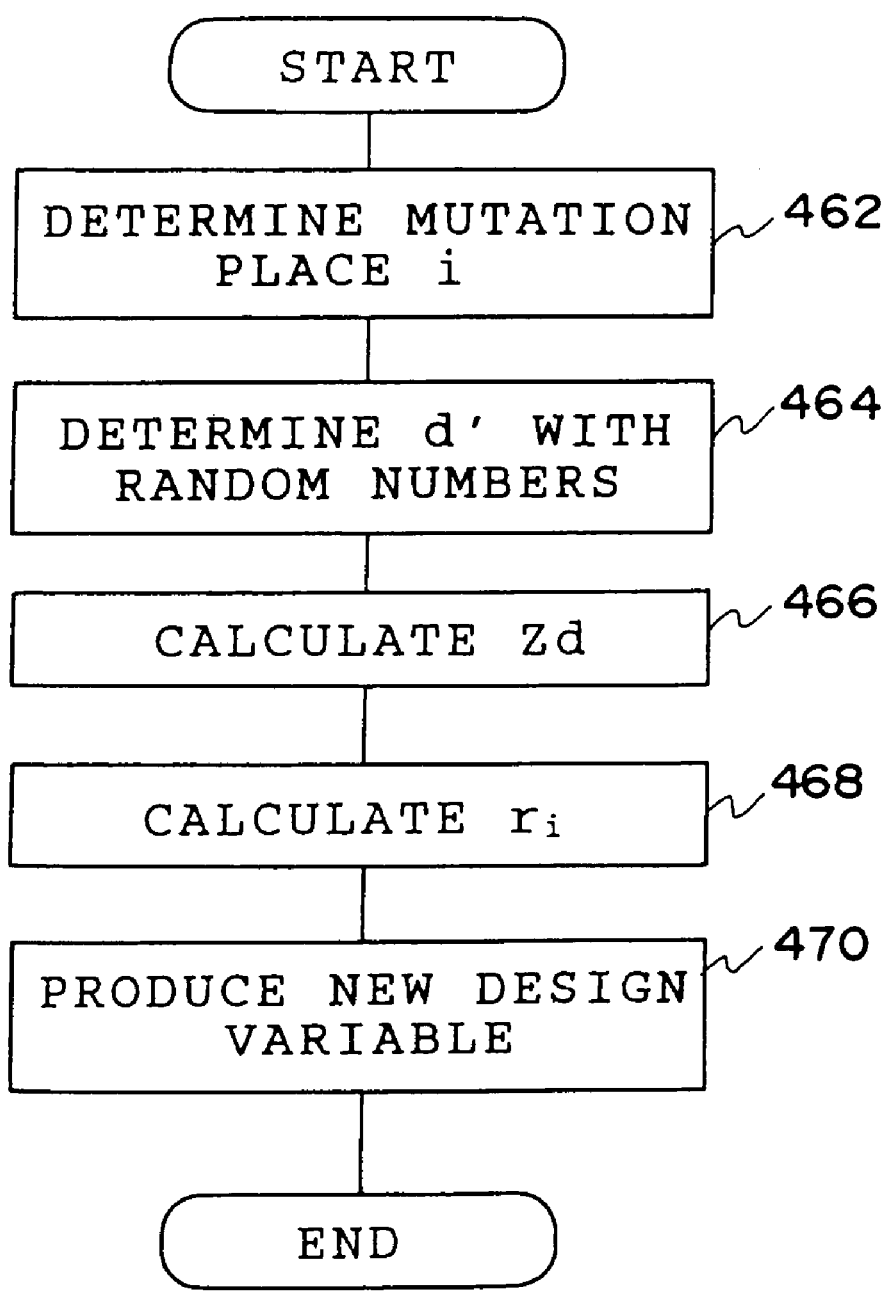
FIG. 14 is a flow chart which shows a flow of a mutation process.

The mutation processing is effected by a mutation routine shown in FIG. 14. First, random numbers are produced in step 462 and a location of mutation, i, is determined by using the random numbers. In step 464, a distance d' is determined by using the random numbers in the range of 0≤d'≤1.

In step 466, with a mapping function of a dome type Z(x) (0≤x≤1, 0Z(x)≤0.5) as shown in FIGS. 12(a), 12(b) or a mapping function of a valley type Z(x) as shown in FIGS. 13(a), 13(b) being used, a function value Zd is obtained by the following expression.

$$Zd = Z(d')$$

After the function value Zd has been obtained in such a manner, in step 468, a new design variable $r_i'$ is obtained by the following expression.

$$r_i' = r_i - \frac{\min(|r_i - B_L|, |r_i - Bu|)}{0.5} \cdot Z_d$$

or $$r_i' = r_i + \frac{\min(|r_i - B_L|, |r_i - Bu|)}{0.5} \cdot Z_d$$

After a design variable $r_i'$ is obtained in such a manner, a design variable vector Vr', which is a list of the new design variable, is obtained in step 470, as in the following form.

$$Vr' = (r_1, r_2, \ldots, r_i', r_{i+1}, \ldots, r_{n-1})$$

In such a manner as described above, values of an objective function and a constraint condition are calculated in step 422 of FIG. 10 on the two new models. In step 424, an adaptive function is calculated from the obtained values of the objective function and the constraint condition by using the expression (14) in a manner similar to the above procedure.

In step 426, the above-described two models are stored. In step 428, it is determined whether the number of models stored in step 426 has reached the number N. When the number has not reached the number N, steps 408 to step 428 are executed repeatedly until the number stored in step 426 reaches the number N. On the other hand, when the stored number has reached N, a decision of convergence is made in step 430. If not converged, the N models are updated with models stored in step 426 and steps 408 to 430 are executed repeatedly. When it is determined that convergence occurs in step 430, a value of a design variable which maximizes a value of the objective function, while roughly satisfying the constraint condition in the N models, is adopted as a value of a design variable which maximizes a value of the objective function while roughly satisfying the constraint condition. In step 432, the value of the design variable is used to determine an optimum tire design in the same manner as in the above-described embodiment, and the routine thereby ends.

The determination of convergence in step 430 is affirmatively made if any of the following conditions is satisfied, which are:

(1) the number of generations has reached M;

(2) the number of linear rows, in which a value of the first objective function is the largest, is equal to or more than q % of the whole; and (3) the maximum value of objective function is not updated in a subsequent generations, wherein M, q, and s are previously inputted by the operator.

TEST EXAMPLES

Next, a description will be given of test examples of tires designed by using a design method according to the embodiments of the present invention.

First, Test Example 1 will be described. The present test example is an application of the present invention to design of the shape of a crown of a tire. In the present test example, tires (size: 205/55R16) were designed based on the following conditions (1) to (5), the designed tires were actually produced, and the tires thus produced were subjected to various tests.

[Conditions]

(1) Past data is not employed;

(2) an orthogonal experimental programming method of level L27-3 is utilized (see an orthogonal table shown in Table 1-$L_{27}3^{13}$);

(3) the number of times of an experiment is set at one;

(4) an objective function OBJ is minimized (contact pressure under an application of lateral force is made uniform), Meanwhile, the objective function is obtained by the following expression:

$$OBJ = \alpha \cdot OBJ1 + \beta \cdot OBJ2$$

$$OBJ1 = \sum_{i=1}^{20} \left(P_i^N - \overline{P^N}\right)^2$$

assuming that addition thereof is allowed only when $P_i^N > 0$; and $$OBJ2 = \sum_{i=1}^{20} \left(P_i^L - \overline{P^L}\right)^2$$

assuming that addition thereof is allowed only when $P_i^L > 0$, wherein $\overline{P^N}$ is an average contact pressure when a load is applied, $\overline{P^L}$ is an average contact pressure when lateral force is applied, $P_i^N$ is a contact pressure distribution when the load is applied (a region directly below the load), $P_i^L$ is a contact pressure distribution when lateral force is applied (a region directly below the load), and α, β are each a weighting factor for an objective function.

(5) design variables are shown as $r_1$, $r_2$, $r_3$, $\theta_1$, and $\theta_2$ (r is a distance between a reference point of a tire and a node point at the innermost side of the tire).

Figure 17:
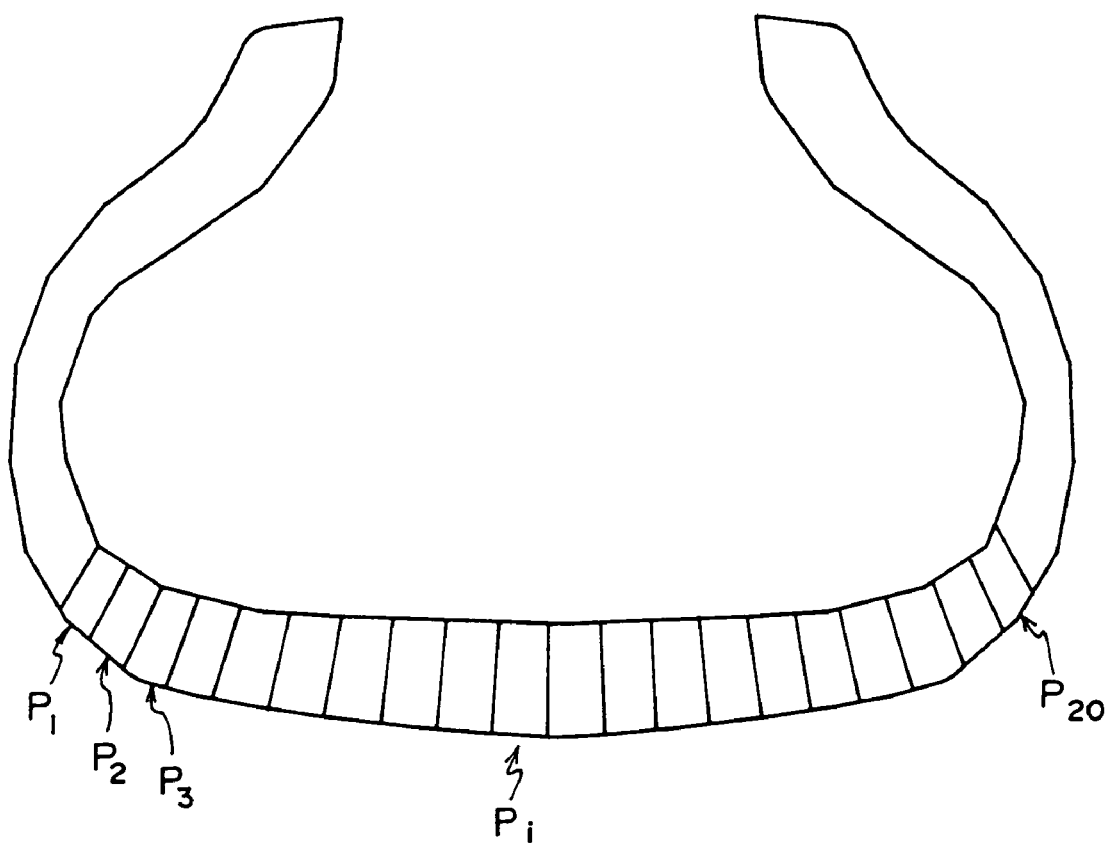
FIG. 17 is a cross-sectional view which shows tire elements located directly below load.

Further, the above-described contact pressure distributions $P_i^N$ and $P_i^L$ are, as shown in FIG. 17, obtained for each of twenty regions into which a tire region in the vicinity of a road-contacting surface of the tire is divided (i.e., there are twenty elements located directly below the load).

Further, a neural network is formed with an input layer having five units, an intermediate layer having forty units, and an output layer having twenty units for each time of an application of the load and the lateral force.

Table 6 listed below shows design variables to be inputted and Table 7 listed below shows that outputs are contact pressure distributions during application of the load and lateral force. The output layer of the neural network is provided to correspond to the contact pressure distributions of each region (element) located directly below the load (see FIG. 17).

Figure 16:
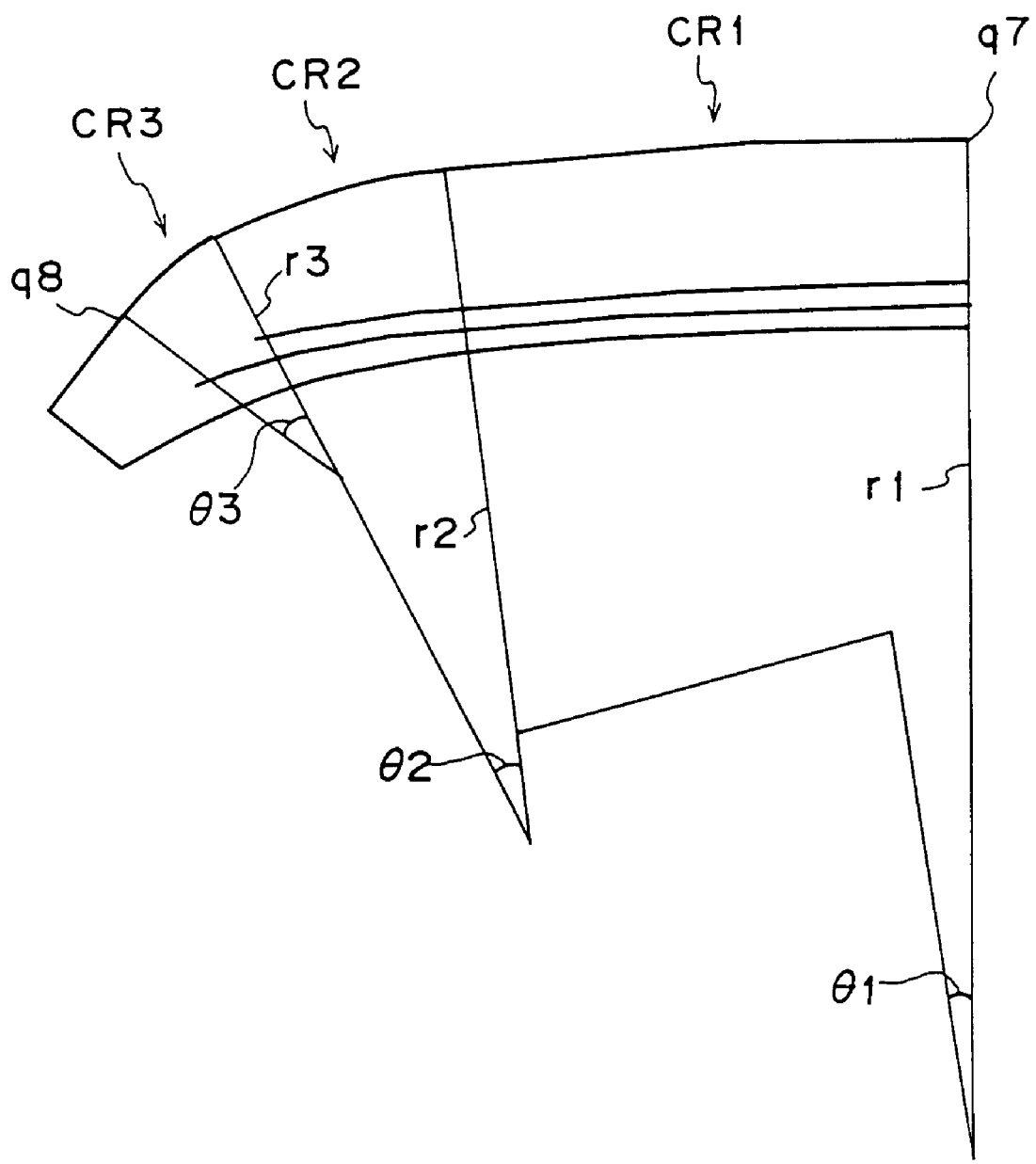
FIG. 16 is an image diagram for illustrating design variables of test example 2.

The design variables $r_1$, $r_2$, $r_3$, $\theta_1$, and $\theta_2$ are set as described below. That is, the shape of a crown portion which is the design variable is provided by approximating a predesignated range of the crown portion using a plurality of circular arcs. For example, as shown in FIG. 16, in the range of the crown portion, which can be approximated, from a node point q7 of the tire center to a node point q8 near the belt end portion, the shape of the crown portion for three regions of CR1, CR2, and CR3 is represented by three circular arcs. The region CR1 can be approximated at a radius of r1 and at an angle of θ1, the region CR2 can be approximated at a radius of r2 and at an angle of θ2, and the region. CR3 can be approximated at a radius of r3 and at an angle of θ3. The radii r1, r2, and r3, and the angles θ1 and θ2 are set as the design variables.

In the above-described example shown in FIG. 16, the shape of the crown portion is represented by three circular arcs in the range from the node point q7 of the tire center to the node point q8 near the belt end portion. However, the number of circular arcs is not limited to the same and may be set at one, two, or at four or more. Further, each of the circular arcs may be not necessarily formed smoothly and continuously, and a coordinate value at the center of each circular arc may be regarded as an independent variable.

Further, in the foregoing, Lagrange interpolation and circular-arc interpolation are used, but spline curve, B-spline curve, Bezier curve, NURBS, and the like may also be used.

Table 8 shown below shows comparison results of tires experimentally manufactured by conventional methods and the tires of the present example, wherein tires were experimentally manufactured under the conditions of the present test example, and actual measurements were obtained of the degree of uniformity when the load and lateral force represented by OBJ1 and OBJ2 are applied. Further, Table 8 indicates that the smaller a value, the more uniform the contact pressure. Further, Table 9 shown below shows comparison results of tires experimentally manufactured by conventional methods and the tires of the present test example, wherein tires were experimentally manufactured under the conditions of the present test example and stability of maneuvering and wear-out were tested. Further, Table 5 indicates that the larger a value, the better the performance.

TABLE 6

| Input | |
|---|---|
| | Design variable |
| 1 | $r_1$ |
| 2 | $r_2$ |
| 3 | $r_3$ |
| 4 | $\theta_1$ |
| 5 | $\theta_2$ |

TABLE 7

| Output | |
|---|---|
| $\overline{P_i^N}$ (i = 1 to 20) | Contact pressure distribution when load is applied |
| $\overline{P_i^L}$ (i = 1 to 20) | Contact pressure distribution when lateral force is applied |

TABLE 8

| | Degree of uniformity when load is applied | Degree of uniformity when lateral load is applied |
|---|---|---|
| Conventional design | 100 | 100 |
| Design 1 of test example α = 1, β = 0 | 71 | 93 |
| Design 2 of test example α = 1, β = 1 | 84 | 82 |

TABLE 9

On-vehicle Riding Quality Evaluation

| | Stability of maneuvering at a small to medium rudder angle | Stability of maneuvering at a large rudder angle | Wear-out |
|---|---|---|---|
| Conventional design | 100 | 100 | 100 |
| Design 1 of test example | 107 | 101 | 127 |
| Design 2 of test example | 105 | 105 | 121 |

Next, a description will be given of Test Example 2. Test Example 2 is an application of the present invention to design of the shape of a side portion of a tire. In the present test example, tires (size: 205/55R16) were designed based on the following conditions (1) to (5), the designed tires were actually produced, and the tires thus produced were subjected to various tests.

[Conditions]

(1) Past data is not employed;

(2) an orthogonal experimental programming method of level L27-3 is utilized (see an orthogonal table shown in Table 1-$L_{27}3^{13}$);

(3) the number of times of an experiment is set at one;

(4) an objective function is made to be the same as that in the case of the design of the crown portion (described above) (contact pressure under an application of lateral force is made uniform), (5) design variables are shown as $r_1$, $r_2$, $r_3$, $\theta_1$, and $\theta_2$ (r is a distance between a reference point of a tire and a node point at the innermost side of the tire).

A neural network is formed with an input layer having five units, an intermediate layer having forty units, and an output layer having twenty units.

Table 1 listed below shows an orthogonal table ($L_{27}3^{13}$) used by the orthogonal experimental programming method of level L27-3. Table 2 listed below shows the design variables to be inputted and Table 3 shows that output is a contact pressure distribution when lateral force is applied.

The design variables $r_1$ to $r_5$ are set as described below.

Figure 15:
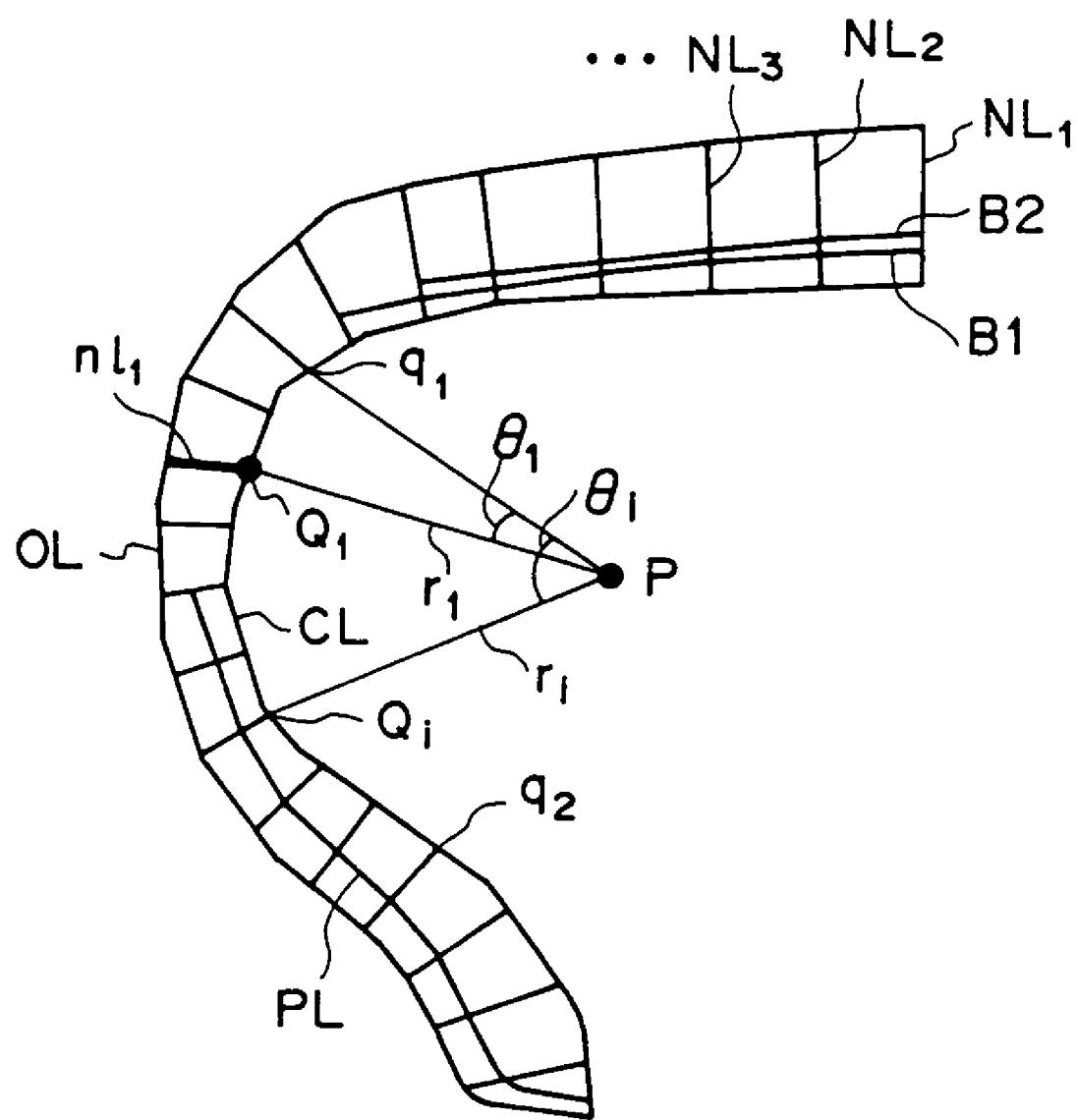
FIG. 15 is an image diagram for illustrating design variables of test example 1.

First, the cross-sectional configuration of a tire in a naturally balanced state is modeled as a reference shape. FIG. 15 shows the cross-sectional configuration of the modeled tire. CL is a carcass line, OL is a line which represents an external surface of a tire, PL is a folded ply line, and B1 and B2 are each a line which represents a belt. Further, the model of the cross-sectional configuration of the tire is divided into a plurality of elements by a plurality of normal lines $NL_1$, $NL_2$, $NL_3$, . . . of the carcass line CL. In the foregoing, there was described a case in which the model of the cross-sectional configuration of the tire is divided into the plurality of elements by the plurality of normal lines of the carcass line. However, the model of the cross-sectional configuration of the tire may be divided into the plurality of elements by a plurality of normal lines of the line which represents the tire external surface or by a plurality of normal lines of the folded ply line. Alternatively, the model may also be divided into elements each having an arbitrary shape such as triangle, depending on design purposes.

The shape of the carcass line is used as a design variable and is determined by Lagrange interpolation which approximates to a curve. Lagrange interpolation processing is provided in such a manner that a reference point P is set in advance in an inner portion of the tire and a range from a node point $q_1$ in the vicinity of an end of a belt to a node point $q_2$ in the vicinity of a position restricted by a rim is designated as the range in which the shape of the tire is changed. With a straight line connecting the node point $q_1$ and the reference point P being used as a reference line, an apparent angle $\theta$ formed between the reference line and a straight line connecting the node point $q_2$ and the reference point P is calculated and an angle increment $d\theta(=\theta/a$ degree of Lagrange interpolation) is thereby calculated. Subsequently, a virtual line is supposed for each angle increment $d\theta$ with the reference line being set as a reference, normal lines $nl_1$, $nl_2$, $nl_3$, . . . that are nearest the virtual line are selected, and distances $r_1$, $r_2$, $r_3$, . . . (which will be represented as $r_i$ in the following expression; i=1, 2, . . . a degree of Lagrange interpolation–1) between the reference point P and each node point $Q_1$, $Q_2$, $Q_3$, at the innermost side on the selected normal lines $nl_1$, $nl_2$, $nl_3$, and apparent angles $\theta_1$, $\theta_2$, $\theta_3$, . . . of the node points $Q_1$, $Q_2$, $Q_3$ (i=1, 2, . . . a degree of Lagrange interpolation–1) are calculated. The distance $r_i$ is set as a design variable. In the present test example, design variables $r_1$ to $r_5$ are set.

Table 4 shown below shows comparison results of tires experimentally manufactured by conventional methods and the tires of the present test example, wherein tires were experimentally manufactured under the conditions of the present test example, and the degree of uniformity when lateral force was applied was measured. Further, Table 4 indicates that the smaller a value, the better the performance. Further, Table 5 shown below shows comparison results of tires manufactured by conventional methods and the tires of the present test example, wherein tires were experimentally manufactured under the conditions of the present test example, and the stability of maneuverability was measured. Further, Table 5 indicates that the larger a value, the better the performance.

TABLE 1

Orthogonal Table ($L_{27}3^{13}$)

| | Design variable | | | | | | | |
|---|---|---|---|---|---|---|---|---|
| | 1 | 2 | 3 | 4 | . . . | 11 | 12 | 13 |
| 1 | 1 | 1 | 1 | 1 | . . . | 1 | 1 | 1 |
| 2 | 1 | 1 | 1 | 1 | . . . | 2 | 2 | 2 |
| 3 | 1 | 1 | 1 | 1 | . . . | 3 | 3 | 3 |
| 4 | 1 | 2 | 2 | 2 | . . . | 3 | 3 | 3 |
| . | . | . | . | . | . . . | . | . | . |
| . | . | . | . | . | . . . | . | . | . |
| . | . | . | . | . | . . . | . | . | . |
| 24 | 3 | 2 | 1 | 3 | . . . | 2 | 1 | 3 |
| 25 | 3 | 3 | 2 | 1 | . . . | 2 | 1 | 3 |
| 26 | 3 | 3 | 2 | 1 | . . . | 3 | 2 | 1 |
| 27 | 3 | 3 | 2 | 1 | . . . | 1 | 3 | 2 |

TABLE 2

Input

| | Design variable |
|---|---|
| 1 | $r_1$ |
| 2 | $r_2$ |
| 3 | $r_3$ |
| 4 | $r_4$ |
| 5 | $r_5$ |

TABLE 3

| | Output |
|---|---|
| $P_i^L$ (i = 1 to 20) | Contact pressure distribution when lateral force is applied |

TABLE 4

| | Degree of uniformity when lateral force is applied |
|---|---|
| Conventional design | 100 |
| Design of test example | 86 |

TABLE 5

| | Stability of maneuvering at a small to medium rudder angle | Stability of maneuvering at a large rudder angle |
|---|---|---|
| Conventional design | 100 | 100 |
| Design of test example | 102 | 104 |

Next, Test Example 3 will be described. The present test example 3 is an application of the present invention to design of a belt structure of a tire. In the present test example, tires (size: 205/55R16) were designed based on the following conditions (1) to (6), the designed tires were actually produced, and the tires thus produced were subjected to various tests.

[Conditions]

(1) Past data is not employed;

(2) D optimum experimental design (experimental point is 30) is employed (see "Optimum Experimental Designs" by A. A. Atkinson and A. N. Donev oxford science Publications. pp 106);

(3) the set number of times of an experiment is one;

(4) an objective function is set such that the maximum value of main skewness between reinforcing layers is minimized;

(5) design variables are $l_1$, $l_2$, $l_3$, $l_4$, $\theta_1$, $\theta_2$, $\theta_3$, $\theta_4$ ($l_1$ is a belt width, $\theta_i$ is a cord angle of reinforcing layers measured from the circumferential direction); and (6) a constraint condition is as follows:

$$L_{min} \leq \sum_{i=1}^{4} l_i \leq L_{max}$$

$$\theta_i^{min} \leq \theta_i \leq \theta_i^{max}$$

Table 10 listed below shows design variables to be inputted and Table 11 listed below shows outputs. A neural network is formed with an input layer having eight units, an intermediate layer having twenty units, and an output layer having four units.

Further, the design variables $r_1$ to $r_5$ are set as described below.

Figure 18:
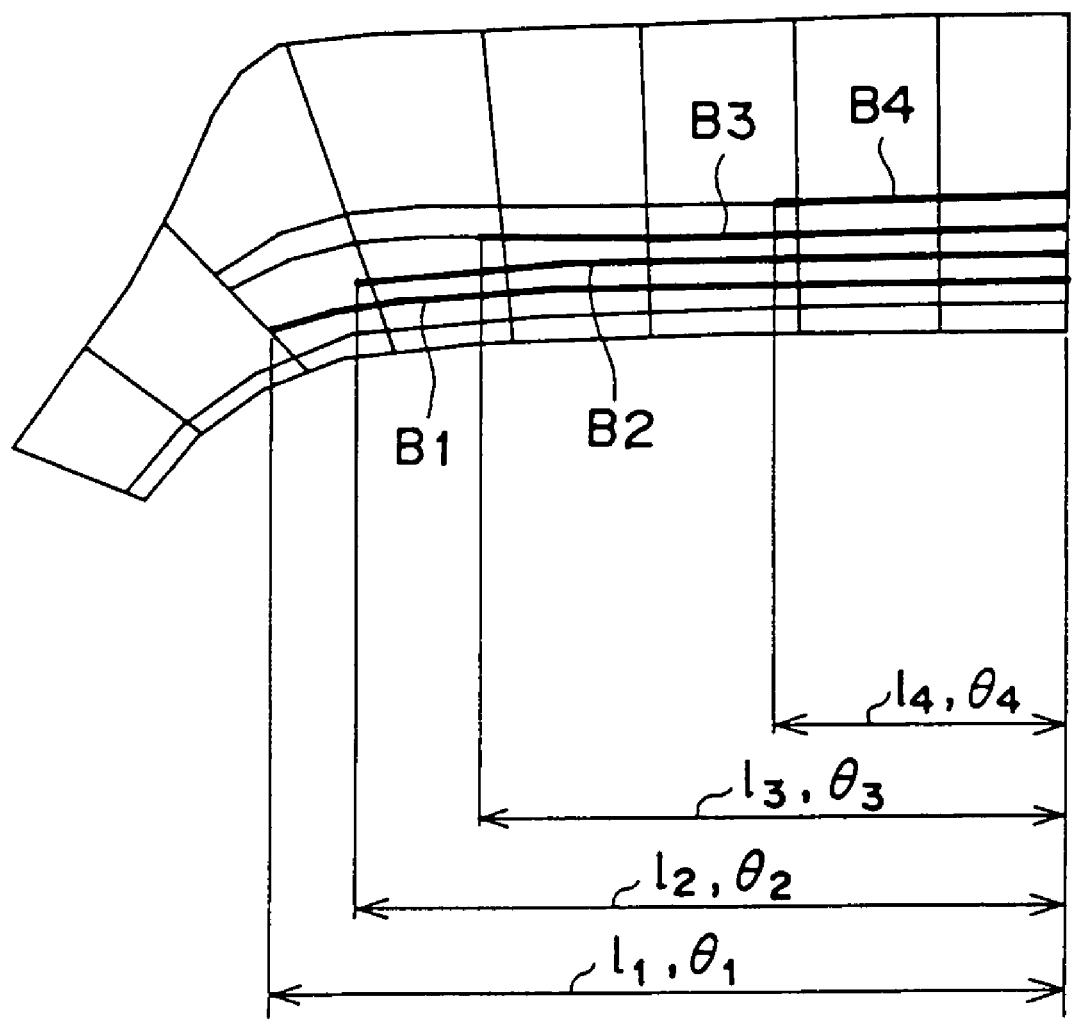
FIG. 18 is an image diagram for illustrating design variables of test example 3.

As illustrated in FIG. 18, as the design variables, a belt width $l_i$ of each line B1, B2, B3, and B4, which each represent a belt layer, and a cord angle $\theta_i$ of the reinforcing layers measured from a circumferential direction are set.

Table 12 shown below shows comparison results of tires experimentally manufactured by conventional methods and the tires of the present test example, wherein: tires were experimentally manufactured under the conditions of the present test example; a load was increased from 2725 kg by 10% at intervals of 30 minutes, using an indoor drum tester at a speed of 60 km/h, an internal pressure of 8.00 kgf/cm², and a slip angle of one degree; and an index value was indicated wherein the load when a failure occurred in a belt portion was the durability of the belt and the control was set at 100. Further, Table 12 indicates that the larger a value, the better the performance.

TABLE 10

| | Input |
|---|---|
| | Design variable |
| 1 | $l_1$ |
| 2 | $l_2$ |
| 3 | $l_3$ |
| 4 | $l_4$ |
| 5 | $\theta_1$ |
| 6 | $\theta_2$ |
| 7 | $\theta_3$ |
| 8 | $\theta_4$ |

TABLE 11

| | Output |
|---|---|
| | Content |
| 1 | Maximum main skewness between belt 1 and ply |
| 2 | Maximum main skewness between belt 1 and belt 2 |
| 3 | Maximum main skewness between belt 2 and belt 3 |
| 4 | Maximum main skewness between belt 3 and belt 4 |

TABLE 12

| | Durability of belt |
|---|---|
| Conventional design | 100 |
| Design of test example | 126 |

INDUSTRIAL APPLICABILITY

As described above, the tire design method, the optimization analyzing apparatus, and the storage medium in which the optimization analyzing program is stored according to the present invention have usability with respect to design of the shape, structure, and pattern of a tire, in producing a tire.

What is claimed is:

1. A tire design method comprising the steps of:
   (a) determining a neural network conversion system in which a correspondence between design parameters of a tire, which represent any one of a cross-sectional configuration of the tire including an internal structure and a structure of the tire, and performances of the tire, which have a plurality of extremums, is established;

(b) determining an objective function which expresses said performances of the tire and setting a constraint condition which constrains an allowable range of at least one of said performances of the tire and manufacturing conditions of the tire; and (c) determining a design parameter of the tire, which gives an optimum value of an objective function, based on said objective function and said constraint condition by using the neural network conversion system determined in said step (a) to design the tire based on the design parameter of the tire to output calculation result of the optimized tire.

2. A tire design method according to claim 1, wherein said step (c) comprises the steps of:

defining the design parameter of the tire as a design variable;

obtaining a value of the design variable, which gives the optimum value of the objective function, by using the neural network conversion system determined in said step (a) while considering the constraint condition; and designing the tire based on the design variable which gives the optimum value of the objective function.

3. A tire design method according to claim 2, wherein said step (c) comprises:

predicting an amount of change in the design variable which gives the optimum value of the objective function while considering the constraint condition based on a sensitivity of the objective function which is a ratio of an amount of change in the objective function to a unit amount of change in the design variable and a sensitivity of the constraint condition which is a ratio of an amount of change in the constraint condition to a unit amount of change in the design variable;

calculating a value of the objective function when the design variable is changed to correspond to a predicted amount and a value of the constraint condition when the design variable is changed to correspond to a predicted amount; and based on the predicted and calculated values, obtaining a value of the design variable, which gives the optimum value of the objective function, by using the neural network conversion system determined in said step (a) while considering the constraint condition.

4. A tire design method according to claim 1, wherein said step (c) comprises the steps of:

(d) selecting, as a design variable, one of the design parameters of the tire included in the neural network conversion system determined in said step (a);

(e) changing a value of the design variable selected in the neural network conversion system determined in said step (a) until the optimum value of the objective function is given by using the neural network conversion system determined in said step (a) while considering the constraint condition; and (f) designing the tire based on the design parameter of the tire obtained by the design variable which gives the optimum value of the objective function.

5. A tire design method according to claim 4, wherein said step (b) comprises the step of determining a constraint condition which constrains an allowable range of at least one of tire performances other than said determined objective function and the design parameters of the tire.

6. A tire design method according to claim 4, wherein said step (e) comprises:

predicting an amount of change in the design variable which gives the optimum value of the objective function while considering the constraint condition based on a sensitivity of the objective function which is a ratio of an amount of change in the objective function to a unit amount of change in the design variable and a sensitivity of the constraint condition which is a ratio of an amount of change in the constraint condition to a unit amount of change in the design variable;

calculating a value of the objective function when the design variable is changed to correspond to a predicted amount and a value of the constraint condition when the design variable is changed to correspond to a predicted amount; and based on the predicted and calculated values, changing a value of the design variable to be selected until the optimum value of the objective function is given by using the neural network conversion system determined in said step (a) while considering the constraint condition.

7. A tire design method according to claim 1, wherein said step (c) comprises the steps of:

defining the design parameters of the tire in the neural network conversion system determined in said step (a) as base models to determine a group for selection comprising a plurality of base models;

determining said objective function, a design variable, a constraint condition and an adaptive function which can be evaluated from the objective function for each base model of the group for selection;

selecting two base models from the groups for selection;

effecting at least one of producing new base models by intersecting the design variables of the two base models at a predetermined probability with each other and producing new base models by modifying in part the design variables of at least one of the two base models;

obtaining an objective function, a constraint condition, and an adaptive function of the base models using the neural network conversion system determined in said step (a) by changing the design variable;

storing the base models whose design variables have been changed and base models whose design variables have not been changed;

repeating the storing step until the number of the stored base models reaches a predetermined number;

determining whether a new group comprising the stored base models of the predetermined number satisfies a predetermined convergence condition;

wherein if not, the above steps are repeated until with the new group defined as the group for selection the group for selection defined satisfies the predetermined convergence condition; and if the predetermined convergence condition is satisfied, designing a tire based on the design parameters of the tire obtained by the design variable, which gives the optimum value of the objective function, among the predetermined number of the stored base models by using the neural network conversion system determined in said step (a) while considering the constraint condition.

8. A tire design method according to claim 1, wherein in said step (a), said neural network conversion system is constructed with data in a multi-layered feed forward type neural network which has learned so as to convert the design parameters of the tire to performances thereof.

9. A tire which is formed according to design parameters designed by a tire design method according to claim 1.

10. An optimization analyzing apparatus comprising:
neural network conversion system calculating means for obtaining a corresponding relation between design parameters of a tire and performances of the tire, which have a plurality of extremums;
input means for inputting an objective function and a constraint condition as optimizations by determining the objective function which expresses the performances of the tire and also by determining the constraint condition which constrains an allowable range of at least one of the performances of the tire and manufacturing conditions of the tire; and
optimization calculation means for obtaining a design parameter of the tire which gives an optimum value of the objective function based on the optimization items inputted by said input means using said neural network conversion system calculation means.

11. An optimization analyzing apparatus according to claim 10, wherein said neural network conversion system calculation means is provided to obtain a non-linear corresponding relation between, on the one hand, the design parameters of the tire, which have the plurality of extremums, and a condition to be applied to the tire, and on the other hand, the performances of the tire.

12. An optimization analyzing apparatus according to claim 10, wherein said optimization calculation means comprises:
selection means which selects one of the design parameters of the tire included in said neural network conversion system calculation means as a design variable;
changing means for changing a value of the design variable selected from said neural network conversion system calculation means until the optimum value of the objective function is given, while considering the constraint condition;
optimum value calculation means for calculating a value of the design variable until the optimum value of the objective function is given by using said neural network conversion system calculation means; and
design means for designing a tire based on the design parameter obtained by the design variable which gives the optimum value of the objective function.

13. An optimization analyzing apparatus according to claim 10, wherein said optimization calculation means comprises the steps of:
defining the design parameters of the tire in the corresponding relation determined in said neural network conversion system calculation means as base models to determine a group for selection composed of a plurality of base models;
determining said objective function, a design variable, a constraint condition, and an adaptive function which can be evaluated from the objective function for each base model in the group for selection;
selecting two base models from the group for selection;
effecting at least one of producing new base models by intersecting the design variables of the selected two base models at a predetermined probability with each other and producing new base models by modifying in part the design variables of at least one of the two base models;
obtaining an objective function, a constraint condition, and an adaptive function of the base models which have been produced using said neural network conversion system calculation means by changing a design variable;
storing the base model whose design variables have been changed and a base model whose design variables have not been changed;
repeating the storing step until the number of the stored base models reaches a predetermined number;
determining whether a new group comprising stored base models of the predetermined number satisfy a predetermined convergence condition;
wherein if not, the new group is defined as the group for selection and the above steps are repeated until the group for selection defined satisfies the predetermined convergence condition; and
if the predetermined convergence condition is satisfied, designing a tire based on a design parameter of the tire obtained by the design variable, which gives the optimum value of the objective function, among the predetermined number of the stored base models by using said neural network conversion system calculation means while considering the constraint condition.

14. An optimization analyzing apparatus according to claim 10, wherein said neural network conversion system calculation means is a multi-layered feed forward type neural network which has learned so as to convert the design parameters of the tire to the performances thereof.

15. A computer readable medium having a stored optimization analyzing program for design of a tire when executed by a computer, wherein the optimization analyzing program is provided to:
determine a corresponding relation by neural network conversion between design parameters of a tire and performances of the tire, which have a plurality of extremums;
determine an objective function which expresses the performances of the tire and determine a constraint condition which constrains an allowable range of at least one of the performances of the tire and manufacturing conditions of the tire; and
obtain a design parameter of the tire, which gives an optimum value of the objective function, based on the determined corresponding relation, the objective function, and the constraint condition to design a tire based on the design parameter of the tire.

16. A computer readable medium having a stored optimization analyzing program for design of a tire according to claim 15, wherein the design of a tire based on the design parameters of the tire comprises:
selecting, as a design variable, one of the design parameters of the tire included in the determined corresponding relation based on the determined corresponding relation, the objective function, and the constraint condition;
changing a value of the design variable selected from the determined corresponding relation until the optimum value of the objective function is given while considering the constraint condition; and
designing the tire based on the design parameter of the tire obtained by the design variable which gives the optimum value of the objective function.

17. A computer readable medium having a stored optimization analyzing program for design of a tire according to claim 16, wherein the constraint condition constrains an allowable range of at least one of the performances of the tire other than the determined objective function and the design parameters of the tire.

18. A computer readable medium having a stored optimization analyzing program for design of a tire according to claim 16, wherein the change of the design variable is effected by:

predicting an amount of change in the design variable which gives the optimum value of the objective function while considering the constraint condition based on a sensitivity of the objective function which is a ratio of an amount of change in the objective function to a unit amount of change in the design variable and a sensitivity of the constraint condition which is a ratio of an amount of change in the constraint condition to a unit amount of change in the design variable;

calculating a value of the objective function when the design variable is changed to correspond to a predicted amount and a value of the constraint condition when the design variable is changed to correspond to a predicted amount; and changing a value of the design variable to be selected based on the predicted and calculated values until the optimum value of the objective function is given while considering the constraint condition.

19. A computer readable medium having a stored optimization analyzing program for design of a tire according to claim 16, wherein the design of a tire based on the design parameter of the tire comprises:

defining the design parameters of the tire in the determined corresponding relation as base models to determine a group for selection composed of a plurality of base models;

determine said objective function, a design variable, a constraint condition, and an adaptive function which can be evaluated from the objective function for each base model in the group for selection;

selecting two base models from the groups for selection;

effecting at least one of producing new base models by intersecting the design variables of the selected two base models at a predetermined probability with each other, and producing new base models by modifying in part the design variables of at least one of the two base models;

obtaining an objective function, a constraint condition, and an adaptive function of the base model using said neural network conversion system calculation means by changing design variables;

storing the base models whose design variables have been changed and a base model whose design variables have not been changed;

repeating the storing step until the number of the stored base models reaches a predetermined number;

determining whether a new group comprising the stored base models of the predetermined number satisfies a predetermined convergence condition;

wherein if not, the new group is defined as the group for selection until the group for selection defined satisfies the predetermined convergence condition; and if the predetermined convergence condition is satisfied, designing a tire based on the design parameter of the tire obtained by the design variable, which gives the optimum value of the objective function, among the predetermined number of the stored base models by using the corresponding relation while considering the constraint condition.

\* \* \* \* \*